United States Patent
Jorgenson

(10) Patent No.: US 10,263,144 B2
(45) Date of Patent: Apr. 16, 2019

(54) SYSTEM AND METHOD FOR LIGHT-EMITTING DEVICES ON LATTICE-MATCHED METAL SUBSTRATES

(71) Applicant: Robbie J. Jorgenson, Minneapolis, MN (US)

(72) Inventor: Robbie J. Jorgenson, Minneapolis, MN (US)

(*) Notice: Subject to any disclaimer, the term of this patent is extended or adjusted under 35 U.S.C. 154(b) by 0 days.

(21) Appl. No.: 15/294,558

(22) Filed: Oct. 14, 2016

(65) Prior Publication Data

US 2017/0110626 A1     Apr. 20, 2017

Related U.S. Application Data

(60) Provisional application No. 62/242,604, filed on Oct. 16, 2015.

(51) Int. Cl.
*H01L 33/00* (2010.01)
*H01L 33/10* (2010.01)
(Continued)

(52) U.S. Cl.
CPC .......... *H01L 33/105* (2013.01); *H01L 33/007* (2013.01); *H01L 33/0045* (2013.01); *H01L 33/06* (2013.01); *H01L 33/32* (2013.01)

(58) Field of Classification Search
CPC ..... H01L 33/105; H01L 33/32; H01L 33/405; H01L 33/06; H01L 33/465; H01L 33/60;
(Continued)

(56) References Cited

U.S. PATENT DOCUMENTS 4,780,749 A    10/1988   Schulman
5,362,977 A    11/1994   Hunt et al.
(Continued)

FOREIGN PATENT DOCUMENTS

JP    09-232631      9/1997
JP    1998321954    12/1998
(Continued)

OTHER PUBLICATIONS

Armitage, et al., "Lattice-matched HfN buffer layers for epitaxy of GaN on Si", "Applied Physics Letters", Aug. 19, 2002, pp. 1450-1452, vol. 81, No. 2.
(Continued)

*Primary Examiner* — Robert G Bachner
(74) *Attorney, Agent, or Firm* — Jonathan M. Rixen; Lemaire Patent Law Firm, P.L.L.C.

(57) ABSTRACT

Light-emitting devices and methods, wherein, in some embodiments, the devices each include a first mirror having a first face, wherein the first mirror includes a metal and, in some embodiments, is a grown-epitaxial metal mirror (GEMM); and an epitaxial structure, wherein the epitaxial structure is lattice matched with and in contact with at least a first portion of the first face of the first mirror, wherein the epitaxial structure includes an active region configured to emit light at a wavelength λ, and wherein the active region is located a first non-zero distance away from the first face of the first mirror such that there is plasmonic coupling between the active region and the first mirror.

20 Claims, 22 Drawing Sheets

US 10,263,144 B2

Page 2

(51) Int. Cl.
*H01L 33/06* (2010.01)
*H01L 33/32* (2010.01)

(58) Field of Classification Search
CPC .......... H01L 21/02458; H01L 21/0254; H01L 33/007; H01L 21/0237; H01L 21/02491; H01L 21/02507; H01L 2933/0058
See application file for complete search history.

(56) References Cited

U.S. PATENT DOCUMENTS

| | | | |
|---|---|---|---|
| 5,557,627 | A | 9/1996 | Schneider et al. |
| 5,619,059 | A | 4/1997 | Li et al. |
| 5,882,948 | A | 3/1999 | Jewell |
| 5,966,393 | A | 10/1999 | Hide et al. |
| 6,045,626 | A | 4/2000 | Yano et al. |
| 6,100,545 | A | 8/2000 | Chiyo et al. |
| 6,239,005 | B1 | 5/2001 | Sumiya et al. |
| 6,420,199 | B1 | 7/2002 | Coman et al. |
| 6,426,512 | B1 | 7/2002 | Ito et al. |
| 6,531,719 | B2 | 3/2003 | Shibata et al. |
| 6,549,556 | B1 | 4/2003 | Hwang et al. |
| 6,563,141 | B1 | 5/2003 | Dawson et al. |
| 6,573,537 | B1 | 6/2003 | Steigerwald |
| 6,589,808 | B2 | 7/2003 | Chiyo et al. |
| 6,614,060 | B1 | 9/2003 | Wang et al. |
| 6,784,085 | B2 | 8/2004 | Cuomo et al. |
| 6,800,500 | B2 | 10/2004 | Coman et al. |
| 6,831,302 | B2 | 12/2004 | Erchak et al. |
| 6,872,965 | B2 | 3/2005 | Ito et al. |
| 6,929,867 | B2 | 8/2005 | Armitage et al. |
| 6,943,377 | B2 | 9/2005 | Gaska et al. |
| 6,969,874 | B1 | 11/2005 | Gee et al. |
| 6,998,281 | B2 | 2/2006 | Taskar et al. |
| 7,030,417 | B2 | 4/2006 | Ishibashi et al. |
| 7,148,520 | B2 | 12/2006 | Yoo |
| 7,176,483 | B2 | 2/2007 | Grupp et al. |
| 7,215,692 | B2 | 5/2007 | Jewell |
| 7,223,998 | B2 | 5/2007 | Schwach et al. |
| 7,257,140 | B2 | 8/2007 | Yoneda |
| 7,279,347 | B2 | 10/2007 | Hon et al. |
| 7,332,365 | B2 | 2/2008 | Nakamura et al. |
| 7,335,924 | B2 | 2/2008 | Liu et al. |
| 7,339,728 | B2 | 3/2008 | Hartig |
| 7,345,315 | B2 | 3/2008 | Hon et al. |
| 7,368,316 | B2 | 5/2008 | Yokouchi et al. |
| 7,465,592 | B2 | 12/2008 | Yoo |
| 7,582,910 | B2 | 9/2009 | David et al. |
| 7,825,006 | B2 | 11/2010 | Nakamura et al. |
| 7,842,939 | B2 | 11/2010 | Jorgenson et al. |
| 7,915,624 | B2 | 3/2011 | Jorgenson |
| 7,964,478 | B2 | 6/2011 | Choi et al. |
| 8,183,557 | B2 | 5/2012 | Iza et al. |
| 8,373,363 | B2 | 2/2013 | Grajcar |
| 8,519,430 | B2 | 8/2013 | Peng et al. |
| 8,541,791 | B2 | 9/2013 | Lamaestre et al. |
| 8,637,390 | B2 | 1/2014 | Ganguli et al. |
| 9,163,997 | B2 | 10/2015 | Vassant et al. |
| 9,330,911 | B2 | 5/2016 | Zhang et al. |
| 9,515,226 | B2 | 12/2016 | Xi |
| 2001/0043629 | A1 | 11/2001 | Sun et al. |
| 2006/0202211 | A1 | 9/2006 | Ueda et al. |
| 2006/0273324 | A1 | 12/2006 | Asai et al. |
| 2006/0275937 | A1 | 12/2006 | Aoyagi et al. |
| 2007/0045607 | A1 | 3/2007 | Chen et al. |
| 2007/0096127 | A1 | 5/2007 | Pattison et al. |
| 2008/0257409 | A1 | 10/2008 | Li et al. |
| 2008/0259980 | A1 | 10/2008 | Wierer et al. |
| 2010/0176369 | A2 | 11/2009 | Oliver et al. |
| 2014/0008660 | A1* | 1/2014 | Jorgenson .......... H01L 21/0237 257/76 |
| 2014/0191188 | A1 | 7/2014 | Vassant et al. |
| 2015/0034902 | A1 | 2/2015 | Jorgenson |

FOREIGN PATENT DOCUMENTS

| | | |
|---|---|---|
| JP | 2000261033 | 9/2000 |
| JP | 2000323753 | 11/2000 |
| WO | 2003163373 | 6/2003 |

OTHER PUBLICATIONS

Belacel, et al., "Controlling spontaneous emission with plasmonic optical patch antennas", "Nano Lett.", Apr. 10, 2013, pp. 1516-1521, vol. 13, No. 4.

Bigourdan, et al., "Design of highly efficient mettallo-dielectric patch antennas for single-photon emission", "Optics Express, Optical Society of America", Feb. 2014, pp. 2337-2347, vol. 22, No. 3.

Chen, N.C., et al., "Nitride light-emitting diodes grown on Si (111) using a TiN template", "Applied Physics Letters", May 10, 2006, pp. 191110-1-191110-3, vol. 38, No. 191110.

Chen, et al., "Metallodielectric hybrid antennas for ultrastrong enhancement of spontaneous emission", "Phys. Rev. Lett.", Jun. 8, 2012, pp. 233001-1-233001-5, vol. 108.

Cho, et al., "Surface plasmon-enhanced light-emitting diodes with silver nanoparticles and SiO2 nano-disks embedded in p-GaN", "Applied Physics Letters", Jul. 2011, pp. 041107-1-041107-3, vol. 99.

Corbett, "Amber green emitters targeting high temperature applications", "Information Societies Technology (IST), AGETHA IST-1999-10292, Final Report", 1999, pp. 1-87.

Devilez, et al., "Compact metallo-dielectric optical antenna for ultra directional and enhanced radiative emission", "ACS Nano ", May 23, 2010, pp. 3390-3396, vol. 4.

Egan, et al., "Dynamic instabilities in master oscillator power amplifier semiconductor lasers", "IEEE Journal of Quantum Electronics", Jan. 1998, pp. 166-170, vol. 34, No. 1.

Esteban, et al., "Optical patch antennas for single photon emission using surface plasmon resonances", "Phys. Rev. Lett", Jan. 15, 2010, p. 026802, vol. 104.

Galfsky, et al., "Active hyperbolic metamaterials: enhanced spontaneous emission and light extraction", "Optica", Jan. 16, 2015, pp. 62-65, vol. 2, No. 1.

Hoffmann, et al., "Fabrication and characterization of plasmonic nanocone antennas for strong spontaneous emission enhancement", "Nanotechnology", Sep. 17, 2015, pp. 404001 1-404001-8, vol. 26.

Isic, et al., "Plasmonic lifetimes and propagation lengths in metallodielectric superlattices", "Phys. Rev. B", Apr. 28, 2014, pp. 165427-1-165427-7, vol. 89.

Jacob, et al., "Engineering photonic density of states using metamaterials", "Appl. Phys. B,", Jun. 16, 2010, pp. 215-218, vol. 100.

Khurgin, et al., "Reflecting upon the losses in plasmonics and metamaterials", "MRS Bulletin", Aug. 2012, pp. 768-779, vol. 37, No. 8.

Kwon, et al., "Surface-plasmon-enhanced light-emitting diodes", "Advanced Materials", Mar. 7, 2008, pp. 1253-1257, vol. 20.

Lau, et al., "Enhanced modulation bandwidth of nanocavity light emitting devices", "Opt. Express", Apr. 27, 2009, pp. 7790-7799, vol. 17.

Lu, et al., "Enhancing spontaneous emission rates of molecules using nanopatterned multilayer hyperbolic metamaterials", "Nature Nanotechnology", Jan. 2014, pp. 48-53, vol. 9.

Naik, et al., "Alternative plasmonic materials: beyond gold and silver", "Advanced Materials", May 15, 2013, pp. 3264-3294, vol. 25.

Nami, et al., "Optical properties of plasmonic light-emitting diodes based on flip-chip III-nitride core-shell nanowires", "Optics Express, Optical Society of America", Dec. 2014, p. 29445, vol. 22, No. 24.

Okamoto, et al., "Epitaxial growth of GaN on single-crystal Mo substrates using HfN buffer layers", "Journal of Crystal Growth", Feb. 15, 2009, pp. 1311-1315, vol. 311, No. 5.

Oliver, Mark H., et al., "Organometallic vapor phase epitaxial growth of GaN on ZrN/AlN/Si substrates", "Applied Physics Letters", Jul. 16, 2008, pp. 023109-1-023109-3, vol. 93, No. 023109.

(56) References Cited

OTHER PUBLICATIONS

Pattison, Paul Morgan, "Fabrication and characterization of Gallium Nitride based Macro-Cavity Light Emitting Diodes", "ProQuest Information and Learing Company", Sep. 2006, p. 1-128, vol. 3238796.

Savelev, et al., "Loss compensation in metal-dielectric layered metamaterials", "Physical Review B", Mar. 27, 2013, pp. 115139-1-115139-7, vol. 87.

Shen, Y.C., et al., "Optical cavity effects in InGaN—GaN quantum-well-heterostructure flip-chip light-emitting diodes", "Applied Physics Letters", Apr. 7, 2003, pp. 2221-2223, vol. 82, No. 14.

Wang, et al., "Dispersion Engineering for Vertical Microcavities Using Subwavelength Gratings", "Physical Review Letters", Feb. 17, 2015.

Wu, et al., "Radiative Enhancement of Plasmonic Nanopatch Antennas", "Plasmonics—published online", Aug. 7, 2015.

\* cited by examiner

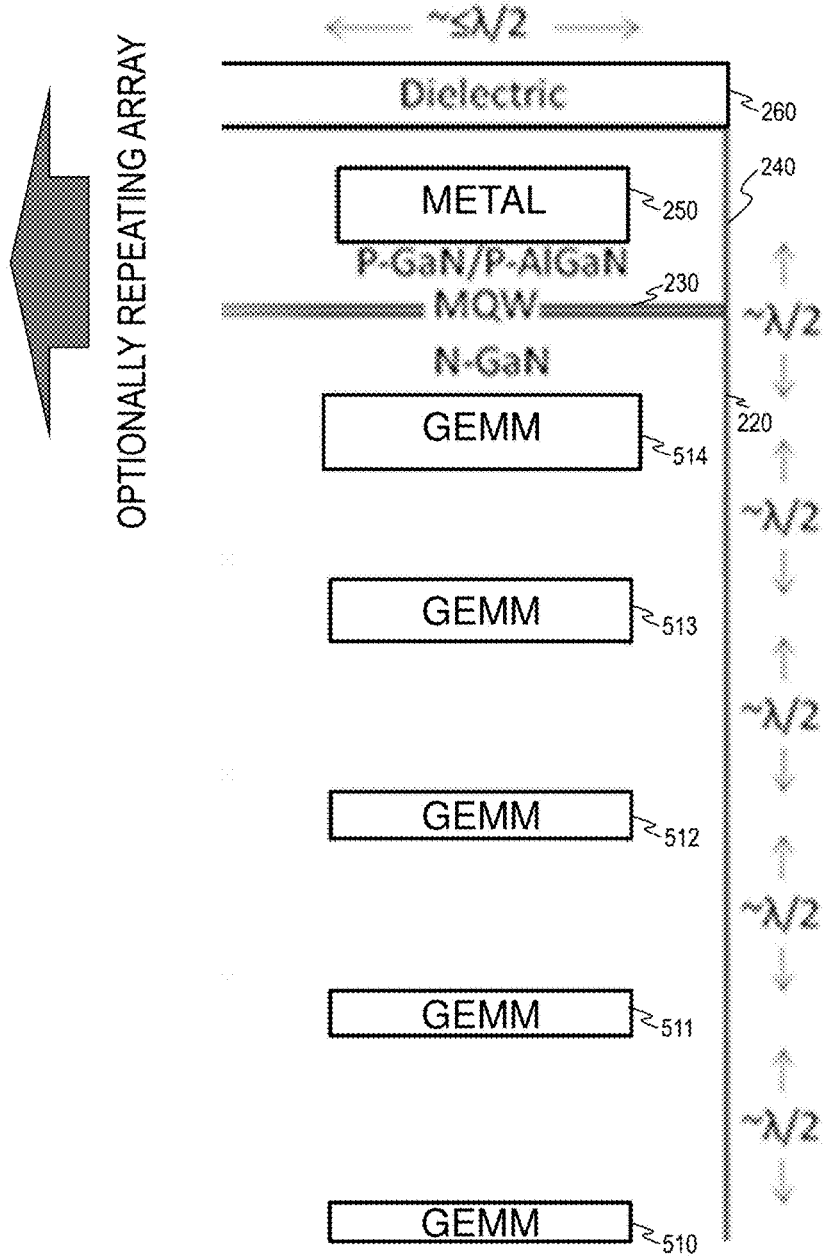

| | MOCVD NUCLEATION RECIPES FOR HIGH QUALITY GALLIUM POLAR OR NITROGEN POLAR GROWTH OF GaN OR AlN UPON ZrN OR HfN. |
|---|---|
| | CONDITION/SEQUENCE |
| A | HIGH III/V RATIO |
| B | UNITY III/V RATIO |
| C | LOW III/V RATIO |
| D | HIGH TEMPERATURE |
| E | MEDIUM TEMPERATURE |
| F | LOW TEMPERATURE |
| G | NITRIDIZATION OF TEMPLATE |
| H | THIN Al |
| I | THIN Al+Ga |
| J | THIN Ga |
| K | THIN AlN PRIOR TO GaN |
| L | THIN GaN PRIOR TO AlN |
| M | THIN AlGaN |
| N | SURFACTANT (I.E. Mg, In) |
| O | LOW $N_2/H_2$ RATIO |
| P | UNITY $N_2/H_2$ RATIO |
| Q | HIGH $N_2/H_2$ RATIO |
| R | HIGH PRESSURE |
| S | MEDIUM PRESSURE |
| T | LOW PRESSURE |
| U | SELECTIVE AREA EPITAXY |
| V | FAST GROWTH RATE |
| W | MEDIUM GROWTH RATE |
| X | SLOW GROWTH RATE |
| Y | p-TYPE III-N MATERIAL |
| Z | n-TYPE III-N MATERIAL |
| AA | *ANY COMBINATION AND/OR SEQUENCE OF CONDITIONS ABOVE.* |
| AB | *ANY OF A THROUGH AA FROM ABOVE LIST THAT IS PERFORMED ON SAPPHIRE, SILICON, GaN, AlN, MgO, SiC, TiN, ZrN, HfN, W, OR ANY OTHER SUITABLE TEMPLATE.* |

SYSTEM AND METHOD FOR LIGHT-EMITTING DEVICES ON LATTICE-MATCHED METAL SUBSTRATES

CROSS-REFERENCE TO RELATED APPLICATIONS

This application claims benefit under 35 U.S.C. § 119(e) of U.S. Provisional Patent Application No. 62/242,604, filed Oct. 16, 2015, which is incorporated herein by reference in its entirety.

The application is related to prior:

U.S. Provisional Patent Application No. 60/835,934, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS" filed Aug. 6, 2006;

U.S. Provisional Patent Application No. 60/821,588, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS" filed Aug. 7, 2006;

U.S. Provisional Patent Application No. 61/066,960, titled "CURRENT-INJECTING/TUNNELING LIGHT EMITTING DEVICE AND METHOD" filed Feb. 25, 2008;

U.S. Provisional Patent Application No. 61/068,299, titled "LIFTOFF METHOD, RESULTING MATERIALS AND DEVICES" filed Mar. 5, 2008;

U.S. Provisional Patent Application No. 61/125,367, titled "Engineered Substrates" filed Apr. 24, 2008;

U.S. Provisional Patent Application No. 61/384,401, titled "III-NITRIDE ALTERNATING-CURRENT LIGHT-EMITTING DEVICE AND METHOD" filed Sep. 20, 2010;

U.S. Provisional Patent Application No. 61/394,725, titled "III-NITRIDE DEVICE AND METHOD" filed Oct. 19, 2010;

U.S. Provisional Patent Application No. 61/445,595, titled "III-NITRIDE DEVICE, MATERIALS AND METHOD" filed Feb. 23, 2011;

U.S. Provisional Patent Application No. 61/610,943, titled "METALLO-SEMICONDUCTOR STRUCTURES FOR III-NITRIDE DEVICES" filed Mar. 14, 2012;

U.S. Provisional Patent Application No. 61/623,885, titled "STRUCTURES FOR III-NITRIDE DEVICES" filed Apr. 13, 2012;

U.S. Provisional Patent Application No. 61/655,477, titled "METAL-BASE TRANSISTORS FOR III-NITRIDE DEVICES" filed Jun. 4, 2012;

U.S. Provisional Patent Application No. 62/385,089, titled "SYSTEM AND METHOD FOR DOPING GALLIUM NITRIDE DURING GROWTH BY PHYSICAL VAPOR DEPOSITION AND RESULTING MATERIALS AND DEVICES" filed Sep. 8, 2016;

U.S. Provisional Patent Application No. 62/396,646, titled "SYSTEM AND METHOD FOR DOPING GALLIUM NITRIDE DURING GROWTH BY PHYSICAL VAPOR DEPOSITION AND RESULTING MATERIALS AND DEVICES" filed Sep. 19, 2016;

U.S. patent application Ser. No. 11/882,730, now U.S. Pat. No. 7,915,624 filed Sep. 3, 2007, titled "III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS";

U.S. patent application Ser. No. 13/075,104, now U.S. Pat. No. 8,253,157 (a divisional of U.S. Pat. No. 7,915,624) filed Mar. 29, 2011, titled "III-NITRIDE LIGHT-EMITTING DEVICES WITH REFLECTIVE ENGINEERED GROWTH TEMPLATES AND METHODS OF MANUFACTURE";

U.S. patent application Ser. No. 13/597,130, now U.S. Pat. No. 8,890,183 (a divisional of U.S. Pat. No. 8,253,157) filed Aug. 28, 2012, titled "III-NITRIDE LIGHT-EMITTING DEVICES WITH REFLECTIVE ENGINEERED GROWTH TEMPLATES AND MANUFACTURING METHOD";

U.S. patent application Ser. No. 12/393,029, now U.S. Pat. No. 7,842,939 filed Feb. 25, 2009, titled "CURRENT-INJECTING/TUNNELING LIGHT-EMITTING DEVICE AND METHOD";

U.S. patent application Ser. No. 12/956,640, now U.S. Pat. No. 8,865,492 (a divisional of U.S. Pat. No. 7,842,939) filed Nov. 30, 2010, titled "METHOD OF FORMING CURRENT-INJECTING/TUNNELING LIGHT-EMITTING DEVICE";

U.S. patent application Ser. No. 13/831,350 titled "MATERIALS, STRUCTURES, AND METHODS FOR OPTICAL AND ELECTRICAL III-NITRIDE SEMICONDUCTOR DEVICES" filed Mar. 14, 2013, which published as U.S. Patent Application Publication 2014/0008660 on Jan. 9, 2014 (now abandoned); and U.S. patent application Ser. No. 14/385,474 titled "MATERIALS, STRUCTURES, AND METHODS FOR OPTICAL AND ELECTRICAL III-NITRIDE SEMICONDUCTOR DEVICES" filed Sep. 15, 2014, which issued as U.S. Pat. No. 9,608,145 on Mar. 28, 2017;

each of which is incorporated herein by reference in its entirety.

There are multiple embodiments described herein, each of which can be combined with one or more other embodiments described herein and/or embodiments described in the patents and publications incorporated by reference.

FIELD OF THE INVENTION

The present invention relates to the field of semiconductor devices and methods of manufacturing semiconductor devices, and more specifically to materials, structures, and methods for hyper emission light-emitting diodes (LED's) on lattice-matched metal substrates for advanced optical fiber networking.

BACKGROUND OF THE INVENTION

The plastic optical fiber (POF) industry is experiencing significant year-over-year growth due to its numerous benefits as compared to more conventional glass-core optical fiber technology or traditional copper wire for transmitting signals and data from point to point. As compared to glass-core optical fiber, POF is not prone to cracking and is therefore more physically robust and able to be installed in areas where tight bends in the fiber are required and is significantly easier to install due to the simplicity that plastic optical fiber can be readily terminated and connected to optical transmitters and receivers, which leads to reduced installations costs. As compared to conventional copper wire, POF transmits signals faster, is immune to electromagnetic interference (EMI), has input/output electrical isolation, cannot short-out or incur damage due to an electrical surge, is immune to lightning strikes, will not produce sparks causing explosion and fire, has no ground loop interference, and very importantly, POF has a smaller installed footprint and weight due to having a smaller diameter cable and weighing less than copper wire.

The widespread implementation of POF systems requires the development of highly efficient light sources that satisfy the unique requirements of POF. Polymethyl methacrylate (PMMA), the most typical core material used for POF, has minimums in the attenuation spectrum at 510 nm (green), 570 nm (green-yellow), and 650 nm (red), with an attenuation of approximately 70 dB/km at 510 nm and 570 nm and an attenuation of approximately 150 dB/km at 650 nm. Light with a wavelength in the green and green-yellow color spectrum will experience the least attenuation and will travel the furthest in the POF and therefore green and green-yellow wavelengths are preferred for POF.

Resonant-Cavity Light-Emitting Diodes (RC-LEDs), which have a structure that is similar to vertical cavity surface emitting lasers (VCSELs), provide a number of advantages over conventional Light-Emitting Diodes (LEDs), such as improved spectral purity, larger bandwidth, enhanced extraction efficiency, and improved light directionality, each of which provides increased light-coupling into the optical fibers. The vertical structure of the RC-LED also leads to lower-cost fabrication, emission normal to the wafer surface (and thereby the possibility of 2D-array operation), improved temperature stability, and high reliability. In addition, for RC-LEDs with cavity lengths on the order of an optical wavelength, the isotropic spontaneous emission is directed into optical modes that can readily escape from the RC-LED into air, instead of being "trapped" inside the LED by Snell's window, control the far-field emission from the RC-LED, optimize coupling of light to the plastic optical fiber, and most importantly increase the modulation rate (i.e., the data rate) of the RC-LED.

While high-brightness InGaN/GaN LEDs with green phosphor are commercially available, there are considerable challenges in trying to fabricate high efficiency ultra-fast green or green-yellow LEDs, and hence, commercially available emitters for POF applications are generally bright-red RC-LEDs at 650 nm. The difficulty in forming green LEDs in a manner that is similar to red RC-LEDs is due to issues with the epitaxy and the material properties of the InGaN/GaN quantum well (QW) structure, which reduce the resonant cavity effects on the stimulated and/or spontaneous emission.

Publication titled "Dynamic instabilities in master oscillator power amplifier semiconductor lasers," by A. Egan, C. Z. Ning, J. V. Moloney, R. A. Indik, M. W. Wright, D. J. Bessert, J. G. McInerney, IEEE Journal of Quantum Electronics, Vol. 34, Issue 1 (1998) is incorporated herein by reference.

Publication titled "Amber green emitters targeting high temperature applications," compiled by B. Corbett, Information Societies Technology (IST), AGETHA IST-1999-10292, Final Report (1999) is incorporated herein by reference.

Publication titled "Lattice-matched HfN buffer layers for epitaxy of GaN on Si," by R. Armitage, Q. Yang, H. Feick, J. Gebauer, E. R. Weber, S. Shinkai, K. Sasaki, Applied Physics Letters, Vol. 81, No. 8 (2002) is incorporated herein by reference.

Publication titled "Organometallic vapor phase epitaxial growth of GaN on ZrN/AlN/Si substrates," by M. H. Oliver, J. L. Schroeder, D. A. Ewoldt, I. H. Wildeson, V. Rawat, R. Colby, P. R. Cantwell, E. A. Stach, and T. D. Sands, Applied Physics Letters 93, 023109 (2008) is incorporated herein by reference.

Publication titled "Surface-plasmon-enhanced light-emitting diodes," by M.-K. Kwon, J.-Y. Kim, B.-H. Kim, II-K. Park, C.-Y. Cho, C. C. Byeon, S.-J. Park, Advanced Materials, 20, 1253-1257 (2008) is incorporated herein by reference.

Publication titled "Enhanced modulation bandwidth of nanocavity light emitting devices," by E. K. Lau, A. Lakhani, R. S. Tucker, and M. C. Wu, Opt. Express 17, 7790-7799 (2009) is incorporated herein by reference.

Publication titled "Epitaxial growth of GaN on single-crystal Mo substrates using HfN buffer layers," by K. Okamoto, S. Inoue, T. Nakano, J. Ohta, H. Fujioka, Journal of Crystal Growth 311 (5), 1311-1315, (2009) is incorporated herein by reference.

Publication titled "Compact metallo-dielectric optical antenna for ultra directional and enhanced radiative emission," by A. Devilez, B. Stout, and N. Bonod, ACS Nano 4, 3390-3396 (2010) is incorporated herein by reference.

Publication titled "Optical patch antennas for single photon emission using surface plasmon resonances," by R. Esteban, T. V. Teperik, and J.-J. Greffet, Phys. Rev. Lett. 104, 026802 (2010) is incorporated herein by reference.

Publication titled "Engineering photonic density of states using metamaterials," by Z. Jacob, J.-Y. Kim, G. V. Naik, A. Boltasseva, E. E. Narimanov, V. M. Shalaev, Appl. Phys. B, 100: 215-218 (2010) is incorporated herein by reference.

Publication titled "Metallodielectric hybrid antennas for ultrastrong enhancement of spontaneous emission," by X.-W. Chen, M. Agio, and V. Sandoghdar, Phys. Rev. Lett. 108, 233001 (2012) is incorporated herein by reference.

Publication titled "Reflecting upon the losses in plasmonics and metamaterials," by J. B. Khurgin, and A. Boltasseva, MRS Bulletin, Vol. 37, Issue 8, 768 (2012) is incorporated herein by reference.

Publication titled "Alternative plasmonic materials: beyond gold and silver," by G. V. Naik, V. M. Shalaev, and A. Boltasseva, Advanced Materials, 25, 3264-3294 (2013) is incorporated herein by reference.

Publication titled "Loss compensation in metal-dielectric layered metamaterials," by R. S. Savelev, I. V. Shadrivov, P. A. Belov, N. N. Rosanov, S. V. Fedorov, A. A. Sukhorukov, and Y. S. Kivshar, Physical Review B 87, 115139 (2013) is incorporated herein by reference.

Publication titled "Controlling spontaneous emission with plasmonic optical patch antennas," by C. Belacel, B. Habert, F. Bigourdan, F. Marquier, J.-P. Hugonin, S. Michaelis de Vasconcellos, X. Lafosse, L. Coolen, C. Schwob, C. Javaux, B. Dubertret, J.-J. Greffet, P. Senellart, and A. Maitre, Nano Lett. 13 (4), 1516-1521 (2013) is incorporated herein by reference.

Publication titled "Plasmonic lifetimes and propagation lengths in metallodielectric superlattices," by G. Isić, R. Gajić, and S. Vuković, Phys. Rev. B 89, 165427 (2014) is incorporated herein by reference.

Publication titled "Enhancing spontaneous emission rates of molecules using nanopatterned multilayer hyperbolic metamaterials," by D. Lu, J. J. Kan, E. E. Fullerton, and Z. Liu, Nature Nanotechnology, Vol. 9, 48 (2014) is incorporated herein by reference.

Publication titled "Optical properties of plasmonic light-emitting diodes based on flip-chip III-nitride core-shell nanowires", by M. Nami, and D. F. Feezell, Optics Express, Optical Society of America, Vol. 22, No. 24, 29445 (2014) is incorporated herein by reference.

Publication titled "Design of highly efficient mettallo-dielectric patch antennas for single-photon emission," by F. Bigourdan, F. Marquier, J.-P. Hugonin, and J.-J. Greffet, Optics Express, Optical Society of America, Vol. 22, No. 3, 2337-2347 (2014) is incorporated herein by reference.

Publication titled "Active hyperbolic metamaterials: enhanced spontaneous emission and light extraction," by T. Galfsky, H. N. S. Krishnamoorthy, W. Newman, E. E. Narimanov, Z. Jacob, and V. M. Menon, Optica Vol. 2, No. 1, 62 (2015) is incorporated herein by reference.

U.S. Patent Application Publication 2005/0030999 to Akinori Yoneda (hereinafter, "Yoneda"), titled "SEMICONDUCTOR LASER DEVICE" published Feb. 10, 2005, and is incorporated herein by reference.

U.S. Patent Application Publication 2006/0275937 to Hidekazu Aoyagi et al. (hereinafter, "Aoyagi et al."), titled "METHOD OF FABRICATING LIGHT-EMITTING SEMICONDUCTOR DEVICE" published Dec. 7, 2006, and is incorporated herein by reference.

U.S. Patent Application Publication 2007/0096127 to P. Morgan Pattison et al. (hereinafter, "Pattison et al."), titled "SEMICONDUCTOR MICRO-CAVITY LIGHT EMITTING DIODE" published May 3, 2007, and is incorporated herein by reference.

U.S. Patent Application Publication 2008/0257409 to Jizhong Li et al. (hereinafter, "Li et al."), titled "PHOTOVOLTAICS ON SILICON" published Oct. 23, 2008, and is incorporated herein by reference.

U.S. Patent Application Publication 2008/0259980 to Jonathan J. Wierer et al. (hereinafter, "Wierer et al."), titled "SEMICONDUCTOR LIGHT EMITTING DEVICE INCLUDING OXIDE LAYER" published Oct. 23, 2008, and is incorporated herein by reference.

U.S. Patent Application Publication 2011/0298062 to Seshadri Ganguli et al. (hereinafter, "Ganguli et al."), titled "METAL GATE STRUCTURES AND METHODS FOR FORMING THEREOF" published Dec. 8, 2011, and is incorporated herein by reference.

U.S. Patent Application Publication 2012/0104455 to Wei-Chih Peng et al. (hereinafter, "Peng et al."), titled "OPTOELECTRONIC DEVICE AND METHOD FOR MANUFACTURING THE SAME" published May 3, 2012, and is incorporated herein by reference.

U.S. Patent Application Publication 2013/0048939 to Jianping Zhang et al. (hereinafter, "Zhang et al."), titled "LIGHT EMITTING DEVICE HAVING GROUP III-NITRIDE CURRENT SPREADING LAYER DOPED WITH TRANSITION METAL OR COMPRISING TRANSITION METAL NITRIDE" published Feb. 28, 2013, and is incorporated herein by reference.

U.S. Patent Application Publication 2014/0175283 to Simon Vassant et al. (hereinafter, "Vassant et al. '283"), titled "TERAHERTZ DETECTION CELL" published Jun. 26, 2014, and is incorporated herein by reference.

U.S. Patent Application Publication 2014/0191188 to Simon Vassant et al. (hereinafter, "Vassant et al. '188"), titled "TERAHERTZ MODULATOR" published Jul. 10, 2014, and is incorporated herein by reference.

U.S. Pat. No. 7,964,478 to Jae Bin Choi et al. (hereinafter, "Choi et al."), titled "GROUP III NITRIDE COMPOUND SEMICONDUCTOR DEVICE" issued Jun. 21, 2011, and is incorporated herein by reference.

U.S. Pat. No. 8,183,557 to Michael Iza et al. (hereinafter, "Iza et al."), titled "(AL,IN,GA,B)N DEVICE STRUCTURES ON A PATTERNED SUBSTRATE" issued May 22, 2012, and is incorporated herein by reference.

U.S. Pat. No. 8,541,791 to Espiau de Lamaestre et al. (hereinafter, "Lamaestre et al."), titled "SOURCE OF PHOTONGS RESULTING FROM A RECOMBINATION OF LOCALIZED EXCITONS" issued Sep. 24, 2013, and is incorporated herein by reference.

There is a need in the POF industry for a high-speed and efficient green-light (e.g., light having a wavelength of approximately 510 nanometers) LED based on the GaN material system.

SUMMARY OF THE INVENTION

In some embodiments, the present invention provides an apparatus that includes a first mirror having a first face, wherein the first mirror includes a metal and is a grown-epitaxial metal mirror (GEMM); and an epitaxial structure, wherein the epitaxial structure is lattice matched with and in contact with at least a first portion of the first face of the first mirror, wherein the epitaxial structure includes an active region configured to emit light at a wavelength $\lambda$, wherein the active region is located a first non-zero distance away from the first face of the first mirror such that there is plasmonic coupling between the active region and the first mirror.

In some embodiments, the present invention provides a method that includes epitaxially growing a first mirror having a first face, wherein the first mirror includes a metal and is a grown-epitaxial metal mirror (GEMM); and epitaxially growing an epitaxial structure, wherein the epitaxial structure is lattice matched with and in contact with at least a first portion of the first face of the first mirror, wherein the epitaxial structure includes an active region configured to emit light at a wavelength $\lambda$, wherein the active region is located a first non-zero distance away from the first face of the first mirror such that there is plasmonic coupling between the active region and the first mirror.

BRIEF DESCRIPTION OF THE DRAWINGS

FIG. 5C is a schematic diagram of a GEMM-based, plasmonic, light-emitting structure 503, according to some embodiments of the present invention.

FIG. 7 is a table 701 describing Metal-Organic Chemical Vapor Deposition (MOCVD) nucleation recipes for high-quality gallium polar or nitrogen polar growth of GaN or AlN upon ZrN or HfN, according to some embodiments of the present invention.

DESCRIPTION OF PREFERRED EMBODIMENTS

Figure 1:
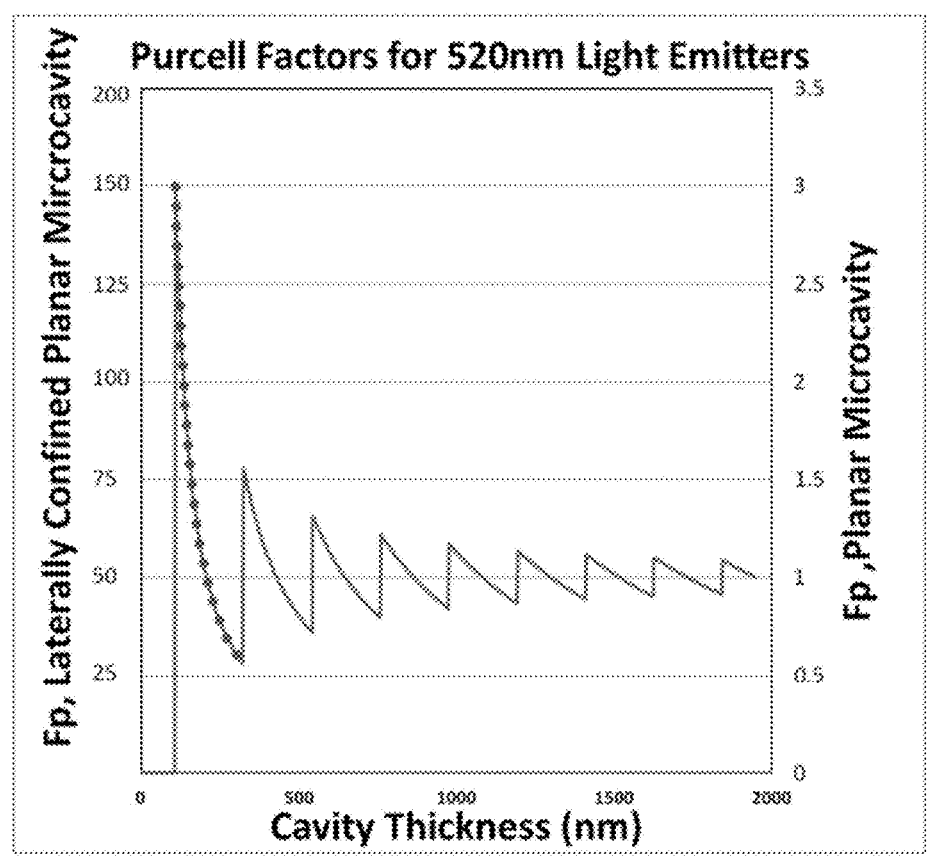
FIG. 1 is a graph 101 showing Purcell factors for 520 nanometer (nm) light emitters based on the placement of the quantum wells within an optical cavity of the emitters, according to some embodiments of the present invention.

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The embodiments shown in the Figures and described here may include features that are not included in all specific embodiments. A particular embodiment may include only a subset of all of the features described, or a particular embodiment may include all of the features described.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

Increases in the modulation rate of RC-LEDs is due to a phenomenon known as the Purcell effect. The Purcell factor, Fp, is defined as the enhanced emission rate within the optical cavity, $R_{cav}$, over the emission rate of the emitter without an optical cavity, $R_{free}$. For half-wavelength microcavities, Fp can be formulated as:

$$F_p = \frac{R_{cav}}{R_{free}} = \frac{3Q(\lambda_c/n)^3}{4\pi^2 V_{mode\_volume}} \quad \text{(Eq. 1)}$$

where λ is the free space wavelength of interest, n is the index of refraction, Q is the quality factor, and V is the mode volume. Edward Purcell showed that the rate of spontaneous emission in a cavity can be enhanced by a factor that is proportional to Q/V. This Equation 1 can be derived from Fermi's golden rule (according to Wikipedia, in "quantum physics, Fermi's golden rule is a simple formula for the constant transition rate (probability of transition per unit time) from one energy eigenstate of a quantum system into other energy eigenstates in a continuum, effected by a perturbation. This rate is effectively constant.").

As used herein, "surface plasmons" are coherent delocalized electron oscillations that exist at the interface between any two materials where the real part of the dielectric function changes sign across the interface (e.g. a metal-dielectric interface).

As used herein, "plasmonics" refers to information transfer in nanoscale structures by means of surface plasmons.

As used herein, "surface plasmon resonance" (sometimes referred to herein as "plasmonic resonance" or "surface plasmon coupling" or "plasmonic coupling") is the resonant oscillation of conduction electrons at the interface between a negative and positive permittivity material stimulated by incident light.

As used herein, "surface plasmon polaritons" (SPPs) are visible-frequency electro-magnetic radiation, which travel along the metal-dielectric interface involving both the highly dense electron charge oscillations in the metal ("surface plasmon") and light ("electromagnetic waves") in the dielectric ("polariton"). In some embodiments, by coupling the light generated within the LED quantum well with the high concentration of surface plasmons, the optical density is greatly increased. In some embodiments, this and the associated field enhancement enables a higher rate of emission such that the radioactive process becomes dramatically more favorable compared to the non-radiative recombination processes which lowers LED efficiency by generation of heat.

As used herein, "hyperbolic metamaterials" refer to metamaterials that behave as a metal when light passes through in one direction and like a dielectric when light passes in the perpendicular direction.

Table 1 provides estimates of the wavelengths where ideal or close to ideal plasmonic resonance occurs between GaN, AlN, ZrN, HfN and Hyperbolic Metamaterials of alternating layers of said materials, according to some embodiments of the present invention.

TABLE 1

|  | Plasmonic Resonance | |
| --- | --- | --- |
|  | GaN | AlN |
| HfN | 490 nm | 450 nm |
| ZrN | 540 nm | 510 nm |
| HfN Localized | 550 nm | 500 nm |
| ZrN Localized | 625 nm | 520 nm |
| Metal Materials AlGaN/HfZrN |  | 400-600 nm |

FIG. 1 is a graph 101 showing Purcell factors for 520 nanometer (nm) light emitters based on the placement of the quantum wells within an optical cavity of the emitters, according to some embodiments of the present invention. Based on the current understanding of plasmonics, if the emission wavelength is shorter than the plasmonic resonance wavelength, there will be less plasmonic interaction. In addition, if the emission wavelength is equal or longer than the plasmonic resonance wavelength, there will be less plasmonic interaction, Knowing this, one can also theoretically determine the appropriate spacing of the optimal placement of the quantum wells within an optical cavity; either planar confinement or both planar and lateral confinement. The plasmonic penetration depths associated with combinations of IIIA-Nitrides and IVB-Nitrides is approximately 50 nm and longer if the active region is coupled between two IVB-Nitride materials. In some embodiments, for planar microcavities with no plasmonic effects, the Purcell factor is as high as three (3), or as high as ten (10) when, in such planar microcavities with no plasmonic, effects, the emission is laterally confined. In some embodiments, if a single-mode cavity with plasmonic effects is formed with lateral confinement, Purcell factors reach to 150 or more. In some embodiments, as the optical-cavity thickness gets shorter, the Purcell factor gets larger, and larger Purcell factors, in some embodiments, lead to higher modulation rates for devices (and data-transfer rates) and higher efficiency light emitters.

In some embodiments, non-plasmonic cavity structures of the present invention provide Purcell factors reaching up to about 10, which increase the current state-of-the-art data rate (approximately 33 MHz) up to a value of approximately 2 GHz. In some embodiments, the present invention provides plasmonic cavity structures having even further enhancement of the spontaneous emission rate and efficiency, along with a Purcell factor of up to 150 (or more) and data rate of up to 30 GHz (or more).

In some embodiments, when plasmonics are involved, the Purcell factor calculation takes on a similar form as mentioned in Equation 1 set forth above, where $R_{SP}$ is the radiative recombination rate due to SPP enhancement, $R_P$ is the radiative recombination rate without the plasmon field present, $k_{SP}$ is the surface plasmon wave vector, $k_o$ is the surface plasmon bandwidth, E is the un-normalized electric field, $\in$ is the dielectric function of GaN, $v_{sp}$ is the group velocity of the surface plasmon, and L represents the penetration of field into the dielectric due to SPPs. Based on this model, in some embodiments, surface plasmon coupling enables a Purcell factor up to approximately 150, which is more than an order of magnitude higher than what is expected in the absence of SPP effects.

In some embodiments, the present invention provides a metal (e.g., HfN, ZrN, or the like) that can facilitate and sustain the subsequent growth of a gallium nitride (GaN)-based LED where the n-type side of the LED can be grown first and subsequent device processing can be more easily implemented. MN and ZrN produced according to some embodiments of the present invention have scattering rates of $6.0 \times 10^{13}$ s$^{-1}$ and $7.0 \times 10^{13}$ s$^{-1}$ where Ag, Au and Al have scattering rates of $3.2 \times 10^{13}$ s$^{-1}$, $12.3 \times 10^{13}$ s$^{-1}$ and $27.3 \times 10^{13}$ s$^{-1}$, respectively (see Table 2).

TABLE 2

| Material | Plasma Frequency | Energy | Scattering Rate |
| --- | --- | --- | --- |
| Silver (Ag) | 2182 THz | 9.0 eV | $3.2 \times 10^{13}$ s$^{-1}$ |
| Hafnium Nitride (HfN) | ~1898 THz | ~7.85 eV | $6.0 \times 10^{13}$ s$^{-1}$ |
| Zirconium Nitride (ZrN) | 1898 THz | 7.85 eV | $7.0 \times 10^{13}$ s$^{-1}$ |
| Gold (Au) | 2081 THz | 8.5 eV | $12.3 \times 10^{13}$ s$^{-1}$ |
| Aluminum (Al) | 3231 THz | 13.2 eV | $27.3 \times 10^{13}$ s$^{-1}$ |

In some embodiments, a grown-epitaxial metal-mirror (GEMM) substrate technology such as described in U.S. Pat. No. 7,915,624 set forth above (and incorporated herein by reference) is used to enable the fabrication of ultra-fast GaN-based green enhanced (e.g., enhanced emission rate based on Purcell factor) LEDs for low-cost POF networks. In some such embodiments, the materials used to grow the GEMM layer include hafnium nitride (HfN) and zirconium nitride (ZrN), both of which are readily engineered by adjusting the process conditions and exhibit superior material properties for integration with III-nitride structures. Both ZrN and HfN are highly conductive metals, closely lattice-matched to GaN (mismatch of HfN~0.35%, and ZrN~1.55%,). Both are also thermally stable at 1100° C., even while in contact with GaN, and their coefficients of thermal expansion (CTE) are very close to that of GaN.

In some embodiments, GEMM provides the following benefits for III-nitride LEDs:
 a. In some embodiments, GEMM is used as a blanket contact to improve current spreading and thermal management.
 b. In some embodiments, GEMM is used as a current injector for a tunneling structure, which may reduce the required operating voltage (see, e.g., U.S. Pat. Nos. 7,842,939 and 8,865,492, each of which is incorporated herein by reference in its entirety).
 c. In some embodiments, the high conductivity of the GEMM layer allows much thinner n-GaN layer, resulting in less wafer bowing, which is important manufacturing on large substrates.
 d. In some embodiments, the ability to grow high quality thin n-type GaN films on GEMM layers also allows the fabrication of micro-cavity LEDs with high Purcell factors, without the reliability problems associated with using noble metals (e.g., Ag).

In some embodiments, the present invention provides: (1) improvement to data transfer rate over POF, (2) improvement to light power output, and (3) light spectrum emission between 510 nm to 520 nm. In some embodiments, in order to improve the modulation performance and photonic power output of III-nitride based blue-green light emitters, the present invention improves the modulation rate and the light power output simultaneously at about 515 nm by improving the rate of photonic emission within the active region of such emitters.

As electrical current is supplied to a semiconductor light emitting device, the energy of each injected electron is converted into either a photon or a quantity of heat. An engineered solution that enables faster rates of emission will naturally have shorter emission rise and fall times (therefore higher modulation rates) and provide a more competitive light producing process making the device more efficient and powerful. In some embodiments, the present invention encloses the LED active region between parallel 'reflectors' to form a subwavelength optical cavity, which provides a dense overlap of optical waves improving the probability of converting charge carriers to photons. In some embodiments, the Purcell effect achieved by this structure is further enhanced by tuning the optical cavity to a specific wavelength, which also improves the probability of producing a photon at a desired wavelength. In some embodiments, subwavelength optical cavity structures provide Purcell factors in a range of about 5 to 10, which, in some embodiments, increases the data rates of 515 nm emitting LEDs from current state-of-the-art levels of 33 up to improved levels of about 2 GHz while also increasing total power efficiency from 12% to 48% if losses are minimized.

In some embodiments, the present invention provides a green LED that has internal quantum efficiency greater than 20% without Purcell enhancement, and the device is modified to achieve Purcell factor of greater than 30. In some such embodiments, the modified internal quantum efficiency is close to unity following a rough estimation of Internal Quantum Efficiency, $IQE_{cavity} = (Fp)(IQE_O)/[(Fp-1)*(IQE_O)+1]$. In some embodiments, the present invention provides Purcell enhancement beyond optical cavity effects by using plasmonics.

In some embodiments, the present invention provides a GEMM-based (e.g., HfN, ZrN, or the like) plasmonic material. In some embodiments, the GEMM is utilized on the n-type side of a GaN based P/N junction where plasmonic coupling is simplified due to the thin n-side depletion region (in some such embodiments, this is made possible since the GEMM is lattice matched to InGaN and conducive to the hard growth environment of Metal-Organic Chemical Vapor Deposition (MOCVD)). In some embodiments, the GEMM is nano-patterned for structures utilizing localized surface plasmon effects (both n-side and p-side). In some embodiments, GEMM has great adhesion to GaN and does not agglomerate at elevated temperatures. In some embodiments, GEMM materials have less losses compared to silver and gold.

Figure 2A:
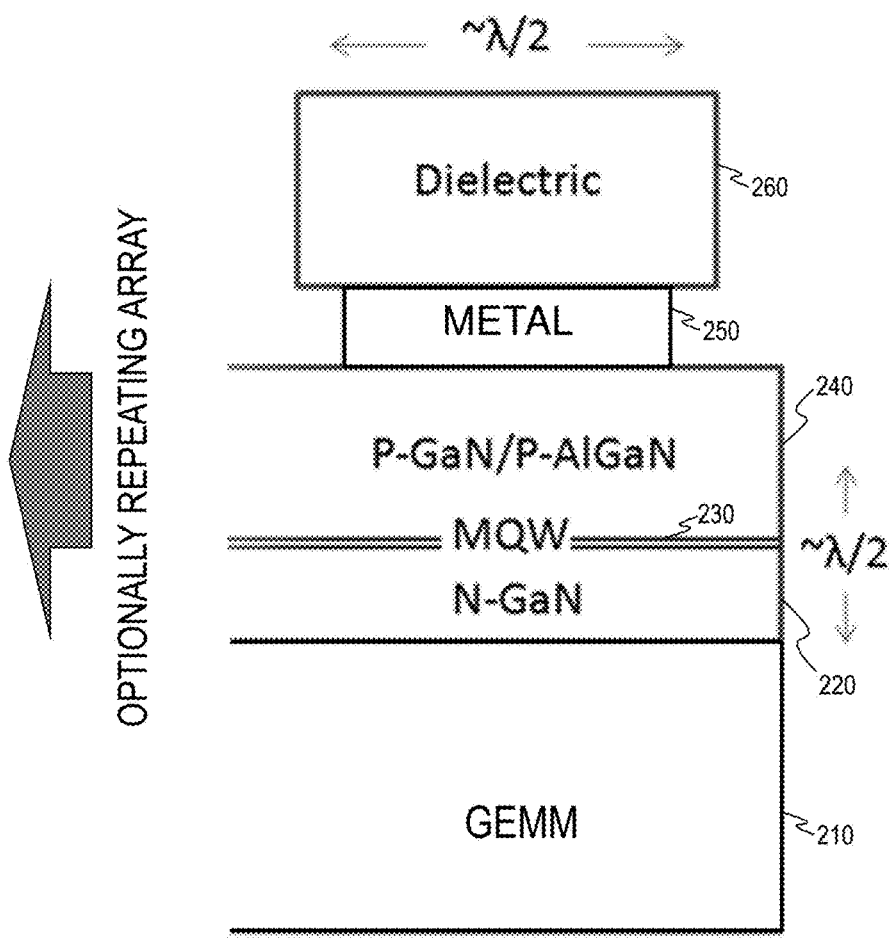
FIG. 2A is a schematic diagram of a GEMM-based, plasmonic, light-emitting structure 201, according to some embodiments of the present invention.

FIG. 2A is a schematic diagram of a GEMM-based, plasmonic, light-emitting structure 201, according to some embodiments of the present invention. In some embodiments, structure 201 is configured to emit light at a wavelength λ (in some embodiments, λ is approximately 520 nm; in some embodiments, λ is approximately 510 nm; in some embodiments, λ is approximately 511 nm; approximately 512 nm; approximately 513 nm; approximately 514 nm; approximately 515 nm; approximately 516 nm; approximately 517 nm; approximately 518 nm; approximately 519 nm; in some embodiments, λ is in a range of approximately 510 to approximately 520 nm; in some embodiments, λ is any other suitable wavelength in the ultraviolet, visible, or infrared spectrum). In some embodiments, structure 201 includes a GEMM substrate 210, a layer of n-type gallium nitride (GaN) 220, an active region 230 (in some embodiments, active region 230 includes multiple quantum wells (MQW)), a layer of p-type GaN (P—GaN) or p-type aluminum gallium nitride (P—AlGaN) 240, a metal layer 250, and a dielectric layer 260. In some embodiments, GEMM substrate 210 and layers 220-240 are formed such as described in U.S. Pat. No. 7,915,624 (hereinafter, "the '624 patent"), which is incorporated herein by reference. In some embodiments, the distance between active region 230 and the GEMM substrate 210 is made short enough (e.g., in some embodiments, approximately ¼ of the wavelength of the emitted light (¼ λ); in some embodiments, approximately ½ of the wavelength of the emitted light (½ λ)); in some embodiments, any other suitable distance) such that there is plasmonic coupling between active region 230 and substrate 210. In some embodiments, metal 250 is as an optical disk antenna. In some embodiments, metal 250 is itself a GEMM layer made according to the '624 patent. In some embodiments, metal 250 has a width of approximately ½ of the wavelength of the emitted light (½ λ). In some embodiments, dielectric layer 260 has an index-of-refraction (n) that is higher than the material lying underneath metal 250 (e.g., in some embodiments, the index-of-refraction of dielectric layer 260 is higher than the index-of-refraction for the GaN of layer 240 and/or layer 220). In some embodiments, dielectric layer 260 includes semiconductors (e.g., gallium-nitride-based materials).

In some embodiments, structure 201 is formed as one structure of a repeating array of structures. In some such embodiments, each respective structure 201 of the array of structures is optically and electrically isolated (e.g., in some embodiments, a groove is etched around a perimeter of the respective structure 201; in some embodiments, boron is implanted around a perimeter of the respective structure 201; in some embodiments, a combination of an inner layer of conductive indium tin oxide and outer layers (i.e., on the perimeter) of non-conductive $SiO_2$ provide the desired isolation—see, e.g., FIGS. 9A-9B). In some embodiments, the electrical and optical isolation modifies the emission probability of the respective structure 201 such that more vertically emitted light is produced (i.e., the light emission from the respective structure 201 is laterally confined)). In some embodiments of structure 201, layer 250 is a distributed Bragg reflector (DBR) and dielectric layer 260 is removed.

Figure 2B:
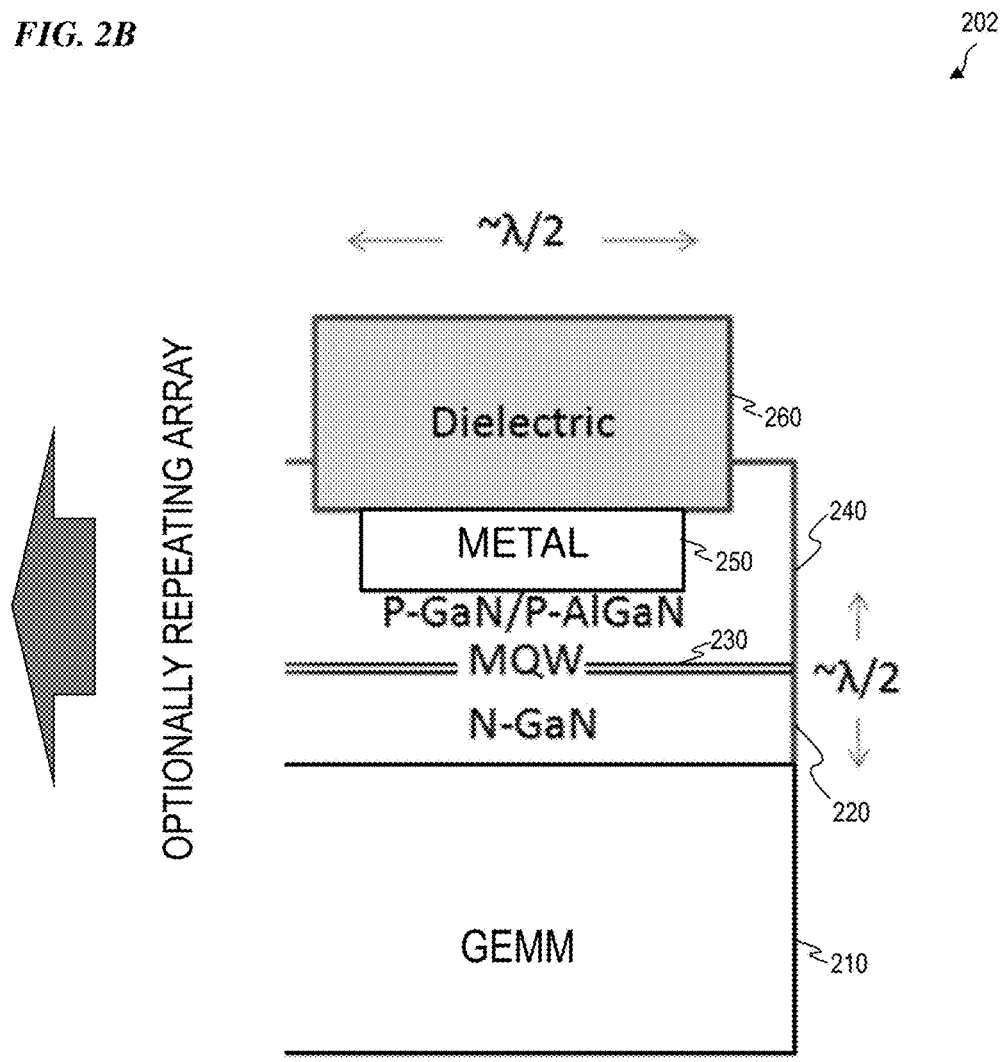
FIG. 2B is a schematic diagram of a GEMM-based, plasmonic, light-emitting structure 202, according to some embodiments of the present invention.

FIG. 2B is a schematic diagram of a GEMM-based, plasmonic, light-emitting structure 202, according to some embodiments of the present invention. In some embodiments, structure 202 is substantially similar to structure 201 except that metal layer 250 and at least a portion of dielectric layer 260 is embedded within layer 240.

Figure 2C:
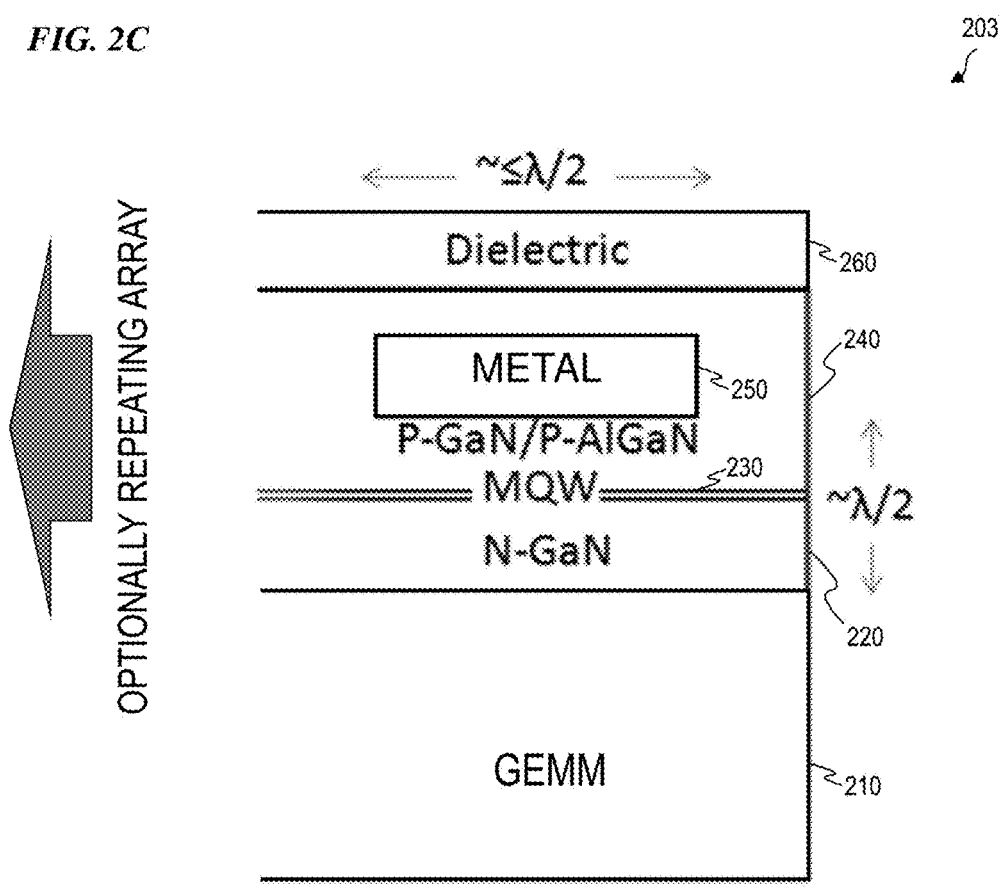
FIG. 2C is a schematic diagram of a GEMM-based, plasmonic, light-emitting structure 203, according to some embodiments of the present invention.

FIG. 2C is a schematic diagram of a GEMM-based, plasmonic, light-emitting structure 203, according to some embodiments of the present invention. In some embodiments, structure 203 is substantially similar to structure 201 except that metal layer 250 is fully embedded within layer 240 and dielectric layer 260 is directly on layer 240. In some embodiments, metal layer 250 has a width that is less than or equal to approximately ½ the wavelength of the emitted light.

Figure 2D:
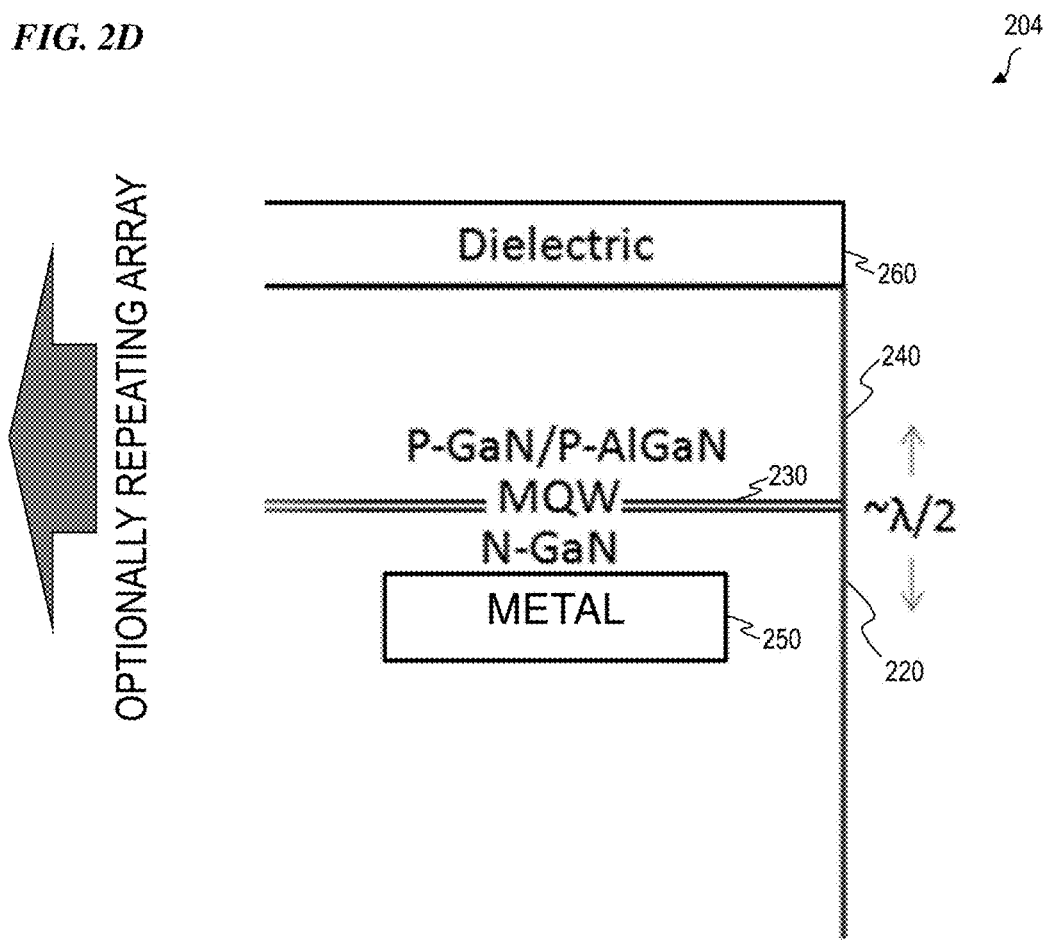
FIG. 2D is a schematic diagram of a light-emitting structure 204, according to some embodiments of the present invention.

FIG. 2D is a schematic diagram of a light-emitting structure 204, according to some embodiments of the present invention. In some embodiments, structure 204 is similar to structure 201 except that the GEMM substrate 210 is removed, dielectric layer 260 is directly on layer 240, and metal layer 250 is located on the opposite side of active region 230 as dielectric layer 260.

Figure 3A:
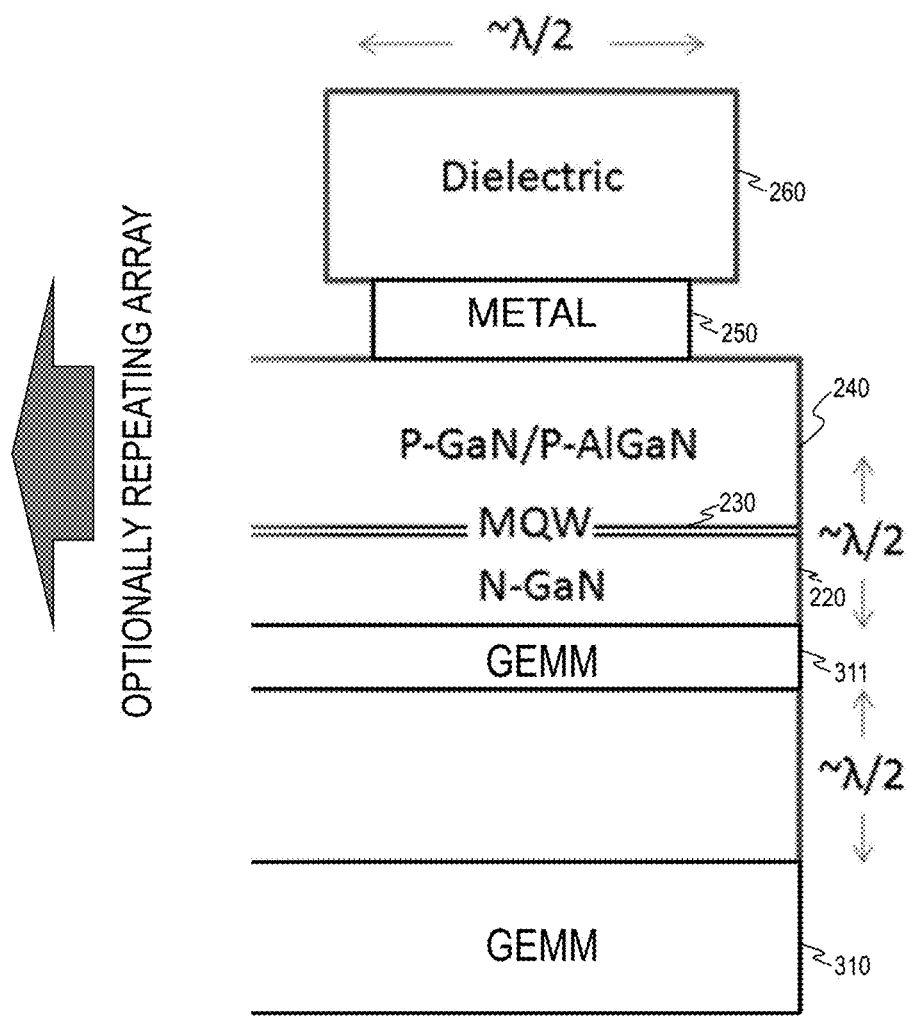
FIG. 3A is a schematic diagram of a GEMM-based, plasmonic, light-emitting structure 301, according to some embodiments of the present invention.

FIG. 3A is a schematic diagram of a GEMM-based, plasmonic, light-emitting structure 301, according to some embodiments of the present invention. In some embodiments, structure 301 is configured to emit light at a wavelength λ. In some embodiments, structure 301 includes a first GEMM layer 310, a second GEMM layer 311, a layer of n-type gallium nitride (GaN) 220, an active region 230 (in some embodiments, active region 230 includes multiple quantum wells (MQW)), a layer of p-type GaN (P—GaN) or p-type aluminum gallium nitride (P—AlGaN) 240, a metal layer 250, and a dielectric layer 260. In some embodiments, GEMM layers 310 and 311 are formed such as described in the '624 patent. In some embodiments, the distance between active region 230 and the second GEMM layer 311 is made short enough (e.g., in some embodiments, approximately ¼ of the wavelength of the emitted light (¼ λ); in some embodiments, approximately of the wavelength of the emitted light (½ λ); in some embodiments, any other suitable distance) such that there is plasmonic coupling between active region 230 and layer 311. In some embodiments, structure 301 is formed as one structure of a repeating array of structures. In some embodiments, the second GEMM layer 311 is partially transparent. In some embodiments, the first GEMM layer 310 is thicker than the second GEMM layer 311. In some embodiments, the first GEMM layer 310 is separated from the second GEMM layer 311 by approximately ½ of the wavelength of the emitted light (½ λ). In some embodiments, first GEMM layer 310 and second GEMM layer 311 are separated by a layer of GaN, AlN, or AlGaN.

Figure 3B:
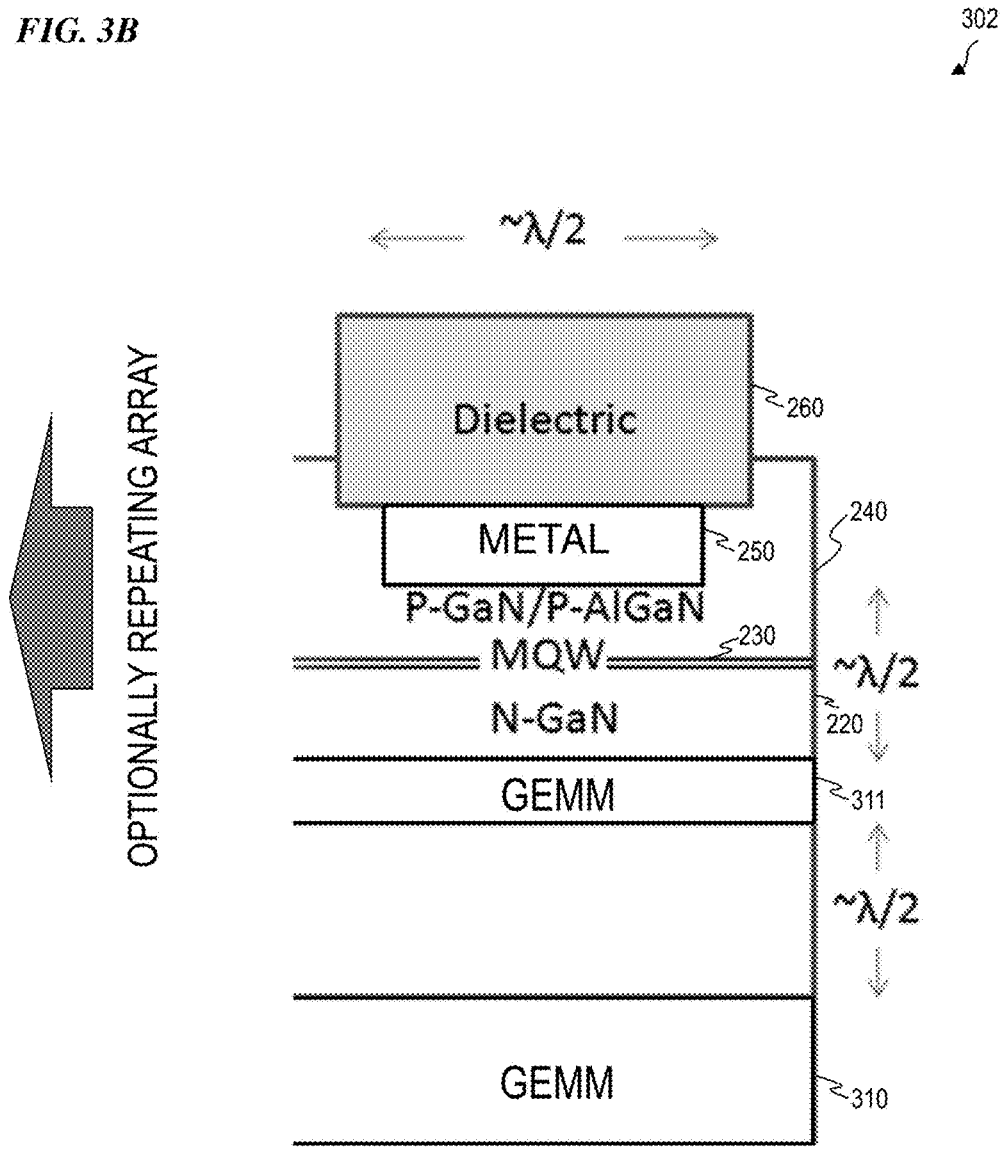
FIG. 3B is a schematic diagram of a GEMM-based, plasmonic, light-emitting structure 302, according to some embodiments of the present invention.

FIG. 3B is a schematic diagram of a GEMM-based, plasmonic, light-emitting structure 302, according to some embodiments of the present invention. In some embodiments, structure 302 is substantially similar to structure 301 except that metal layer 250 and at least a portion of dielectric layer 260 is embedded within layer 240.

Figure 3C:
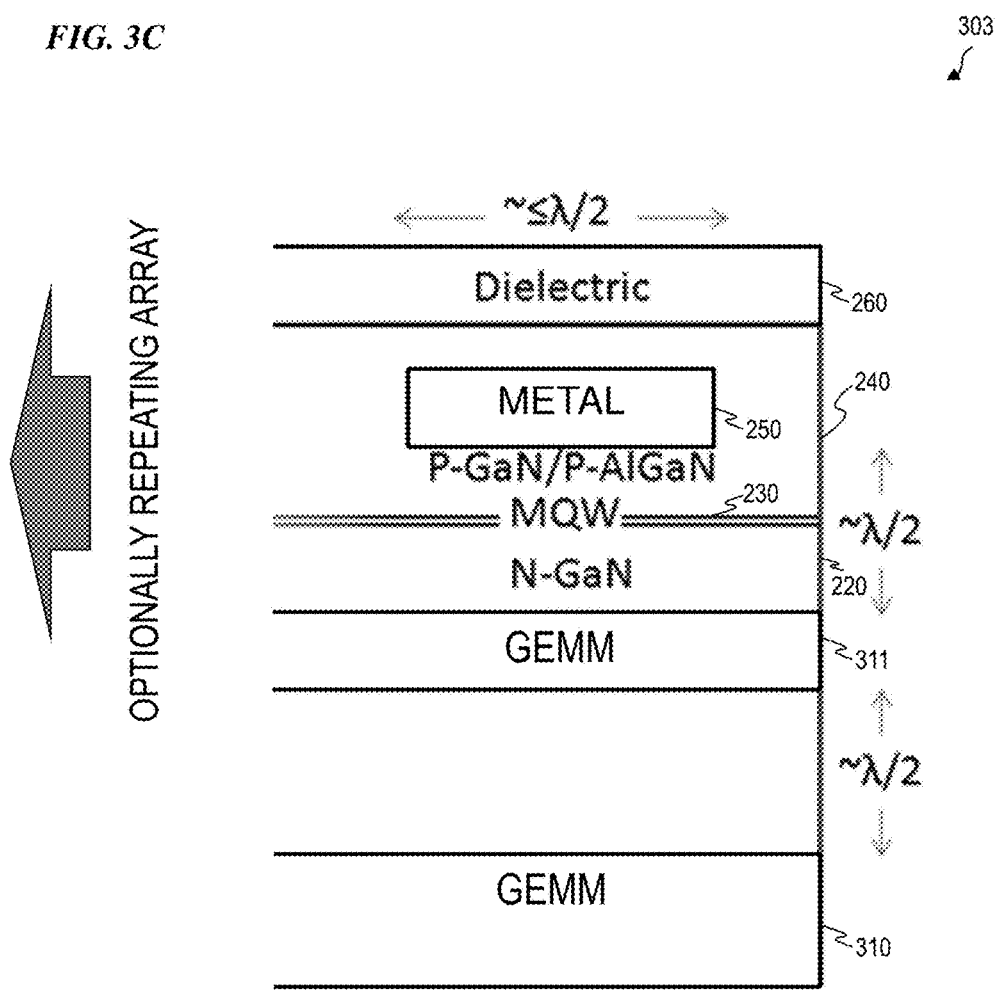
FIG. 3C is a schematic diagram of a GEMM-based, plasmonic, light-emitting structure 303, according to some embodiments of the present invention.

FIG. 3C is a schematic diagram of a GEMM-based, plasmonic, light-emitting structure 303, according to some embodiments of the present invention. In some embodiments, structure 303 is substantially similar to structure 301 except that metal layer 250 is fully embedded within layer 240 and dielectric layer 260 is directly on layer 240. In some embodiments, metal layer 250 has a width that is less than or equal to approximately ½ the wavelength of the emitted light.

Figure 3D:
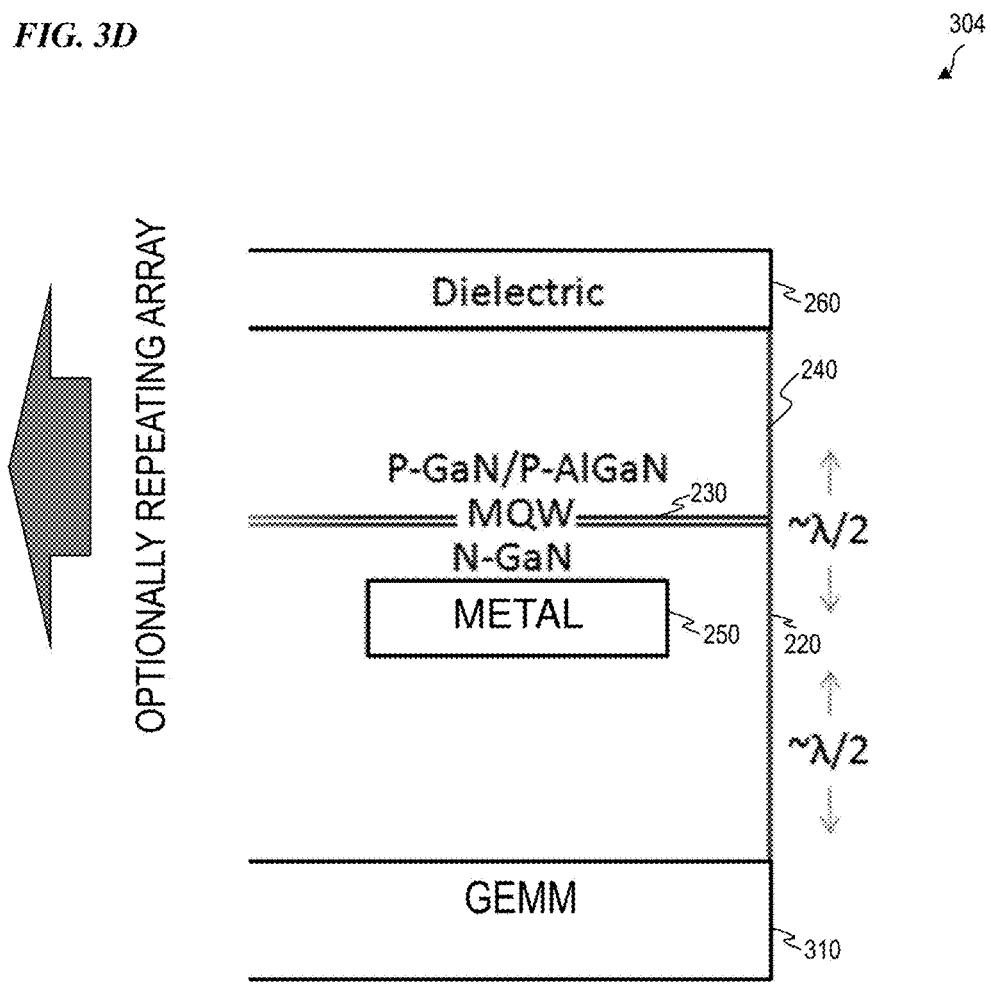
FIG. 3D is a schematic diagram of a light-emitting structure 304, according to some embodiments of the present invention.

FIG. 3D is a schematic diagram of a light-emitting structure 304, according to some embodiments of the present invention. In some embodiments, structure 304 is similar to structure 301 except that the GEMM layer 311 is removed, dielectric layer 260 is directly on layer 240, and metal layer 250 is located on the opposite side of active region 230 as dielectric layer 260.

Figure 4A:
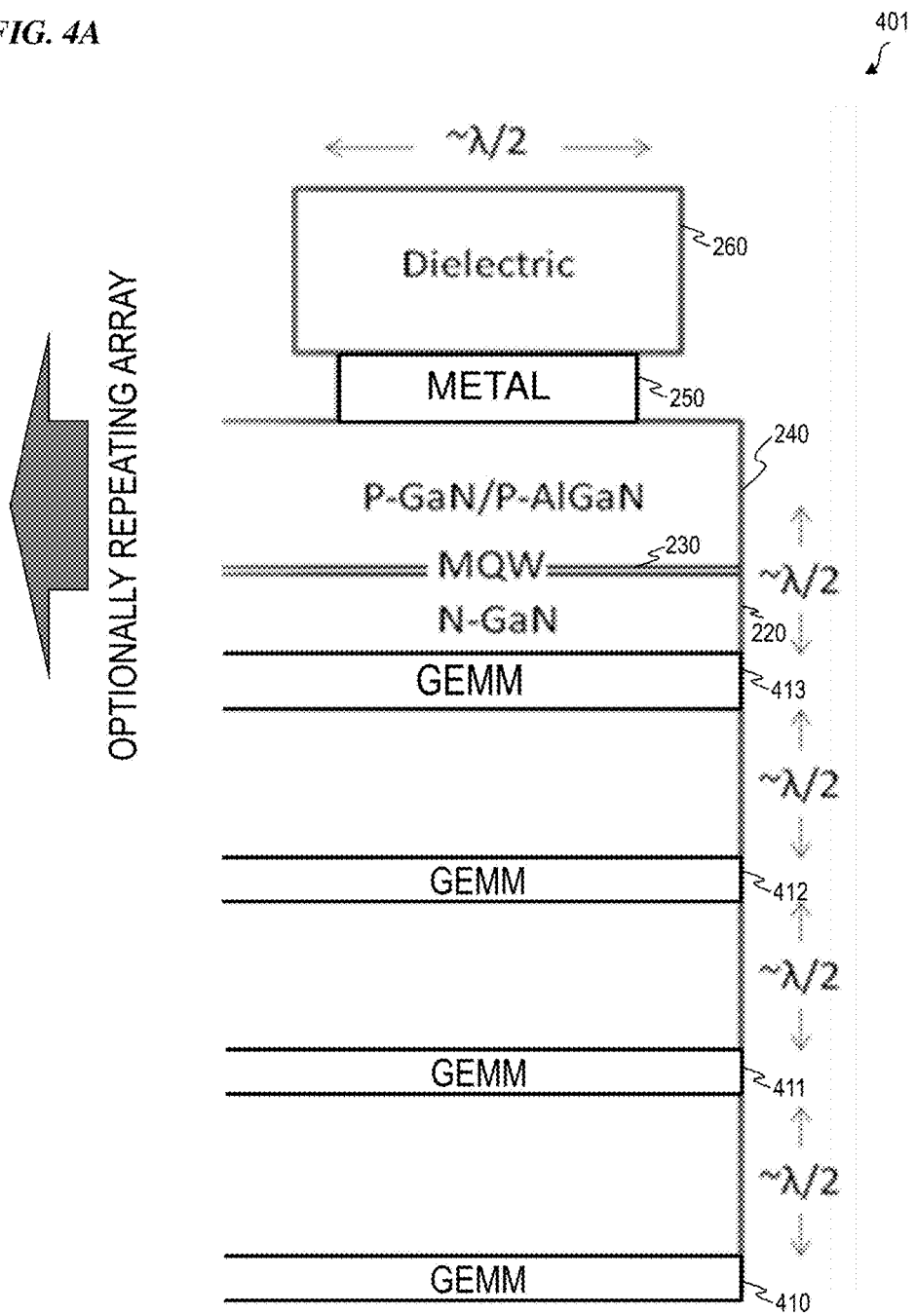
FIG. 4A is a schematic diagram of a GEMM-based, plasmonic, light-emitting structure 401, according to some embodiments of the present invention.

FIG. 4A is a schematic diagram of a GEMM-based, plasmonic, light-emitting structure 401, according to some embodiments of the present invention. In some embodiments, structure 401 is configured to emit light at a wavelength a. In some embodiments, structure 401 includes a first GEMM layer 410, a second GEMM layer 411, a third GEMM layer 412, a fourth GEMM layer 413, a layer of n-type gallium nitride (GaN) 220, an active region 230 (in some embodiments, active region 230 includes multiple quantum wells (MQW)), a layer of p-type GaN (P—GaN) or p-type aluminum gallium nitride (P—AlGaN) 240, a metal layer 250, and a dielectric layer 260. In some embodiments, GEMM layers 410, 411, 412, and 413 are formed such as described in the '624 patent. In some embodiments, the distance between active region 230 and the fourth GEMM layer 413 is made short enough (e.g., in some embodiments, approximately ¼ of the wavelength of the emitted light (¼ λ)); in some embodiments, approximately ½ of the wavelength of the emitted light (½ λ); in some embodiments, any other suitable distance) such that there is plasmonic coupling between active region 230 and layer 413. In some embodiments, structure 401 is formed as one structure of a repeating array of structures. In some embodiments, each of the GEMM layers 410-413 is partially transparent. In some embodiments, each respective GEMM layer is separated from its neighbor GEMM layer by approximately ½ of the wavelength of the emitted light (½ λ). In some embodiments, each respective GEMM layer is separated from its neighbor GEMM layer by a layer of GaN, AlN, or AlGaN.

Figure 4B:
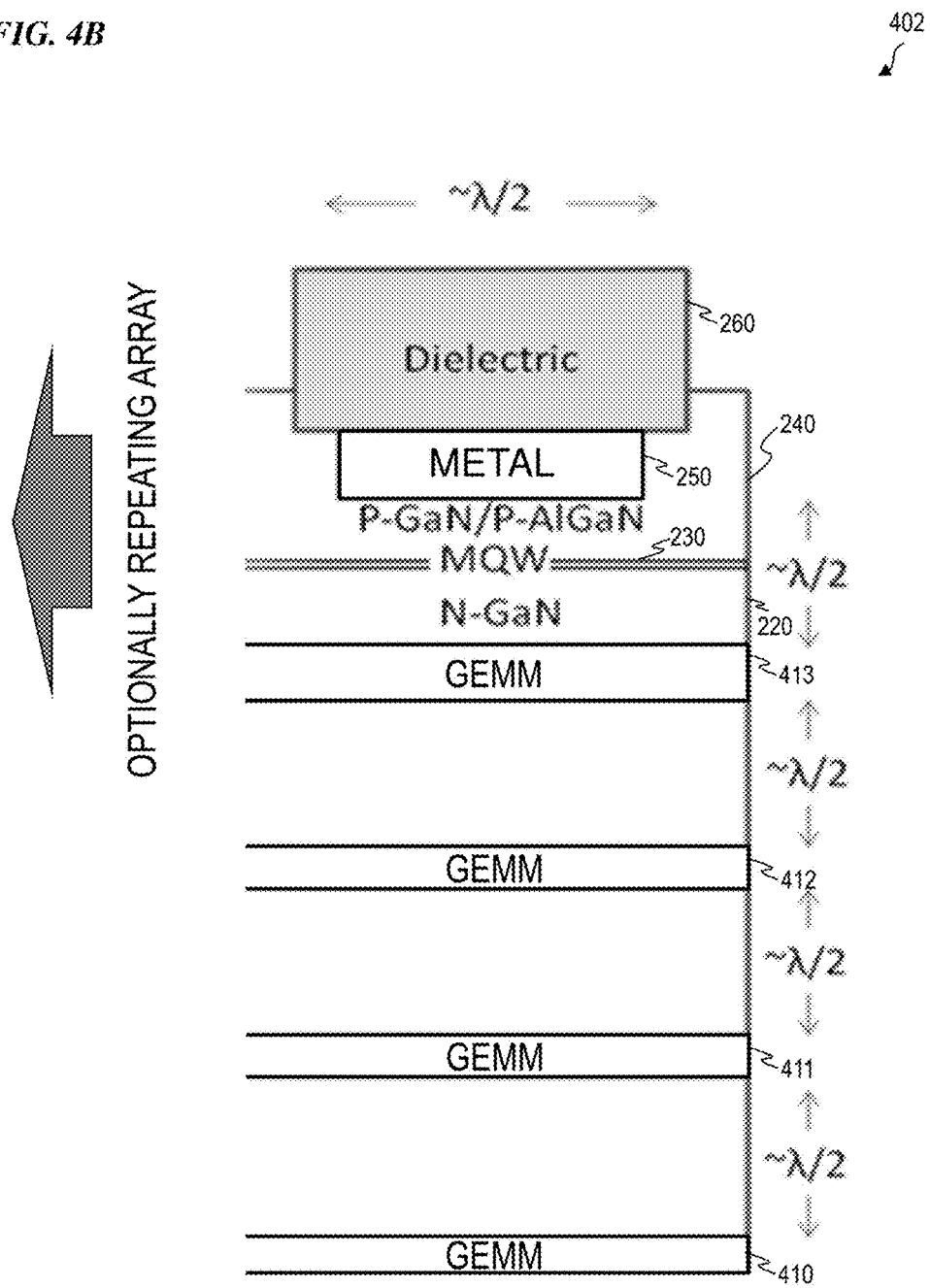
FIG. 4B is a schematic diagram of a GEMM-based, plasmonic, light-emitting structure 402, according to some embodiments of the present invention.

FIG. 4B is a schematic diagram of a GEMM-based, plasmonic, light-emitting structure 402, according to some embodiments of the present invention. In some embodiments, structure 402 is substantially similar to structure 401 except that metal layer 250 and at least a portion of dielectric layer 260 is embedded within layer 240.

Figure 4C:
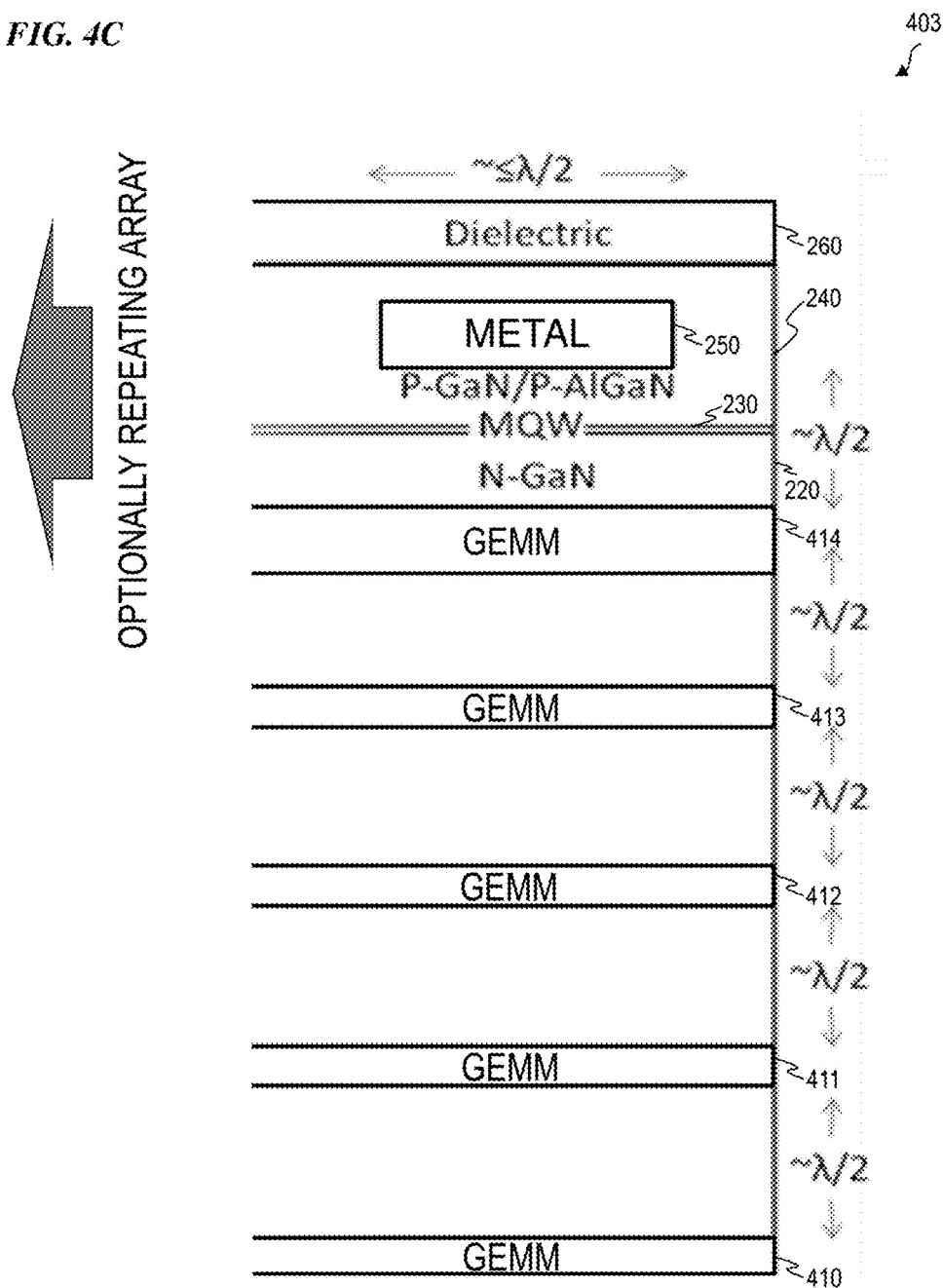
FIG. 4C is a schematic diagram of a GEMM-based, plasmonic, light-emitting structure 403, according to some embodiments of the present invention.

FIG. 4C is a schematic diagram of a GEMM-based, plasmonic, light-emitting structure 403, according to some embodiments of the present invention. In some embodiments, structure 403 is substantially similar to structure 401 except that metal layer 250 is fully embedded within layer 240, dielectric layer 260 is directly on layer 240, and an additional fifth GEMM layer 414 is added (in some such embodiments, GEMM layer 414 has a thickness that is greater than the thickness of each of layers 410-413). In some embodiments, metal layer 250 has a width that is less than or equal to approximately ½ the wavelength of the emitted light.

Figure 4D:
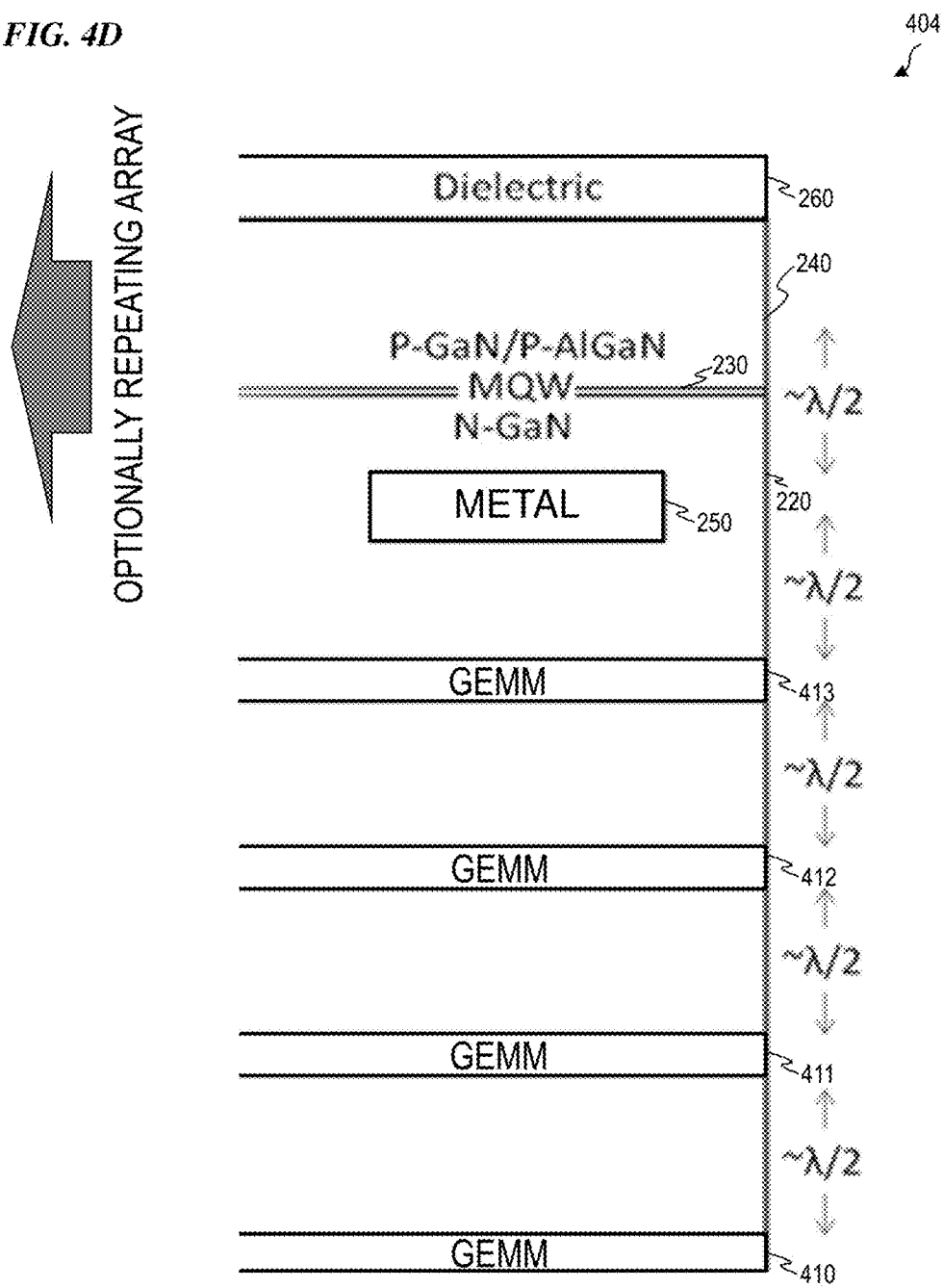
FIG. 4D is a schematic diagram of a light-emitting structure 404, according to some embodiments of the present invention.

FIG. 4D is a schematic diagram of a light-emitting structure 404, according to some embodiments of the present invention. In some embodiments, structure 404 is similar to structure 401 except that dielectric layer 260 is directly on layer 240 and metal layer 250 is located on the opposite side of active region 230 as dielectric layer 260.

Figure 5A:
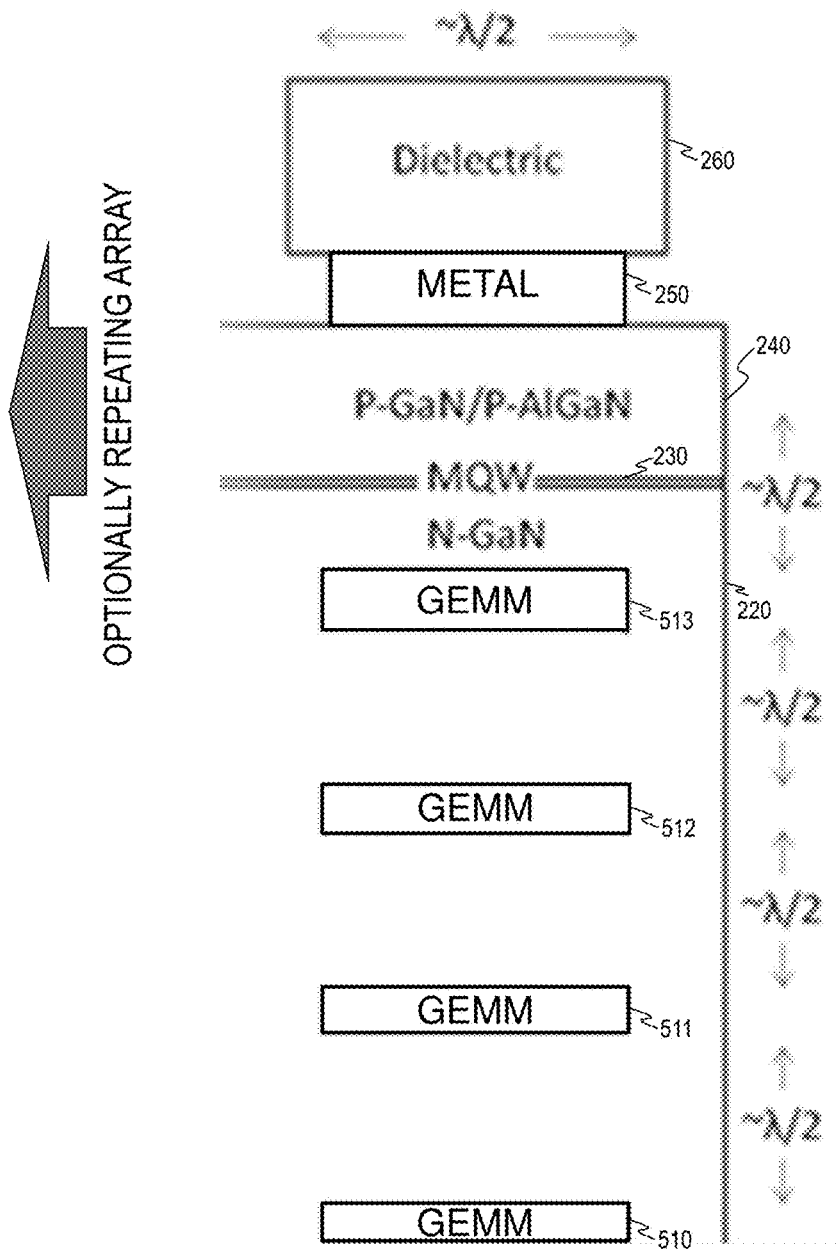
FIG. 5A is a schematic diagram of a GEMM-based, plasmonic, light-emitting structure 501, according to some embodiments of the present invention.

FIG. 5A is a schematic diagram of a GEMM-based, plasmonic, light-emitting structure 501, according to some embodiments of the present invention. In some embodiments, structure 501 is configured to emit light at a wavelength a. In some embodiments, structure 501 includes a first GEMM layer 510, a second GEMM layer 511, a third GEMM layer 512, a fourth GEMM layer 513, a layer of n-type gallium nitride (GaN) 220, an active region 230 (in some embodiments, active region 230 includes multiple quantum wells (MQW)), a layer of p-type GaN (P—GaN) or p-type aluminum gallium nitride (P—AlGaN) 240, a metal layer 250, and a dielectric layer 260. In some embodiments, GEMM layers 510, 511, 512, and 513 are formed such as described in the '624 patent. In some embodiments, the distance between active region 230 and the fourth GEMM layer 513 is made short enough (e.g., in some embodiments, approximately ¼ of the wavelength of the emitted light (¼ λ); in some embodiments, approximately ½ of the wavelength of the emitted light (½ λ); in some embodiments, any other suitable distance) such that there is plasmonic coupling between active region 230 and layer 513. In some embodiments, structure 501 is formed as one structure of a repeating array of structures. In some embodiments, each of the GEMM layers 510-513 is partially transparent. In some embodiments, each respective GEMM layer is separated from its neighbor GEMM layer by approximately ½ of the wavelength of the emitted light (½ λ). In some embodiments, each respective GEMM layer is separated from its neighbor GEMM layer by a layer of GaN, AlN, or AlGaN. In some embodiments, each of the GEMM layers 510-513 and metal layer 250 has a width of approximately ½ of the wavelength of the emitted light (½ λ).

Figure 5B:
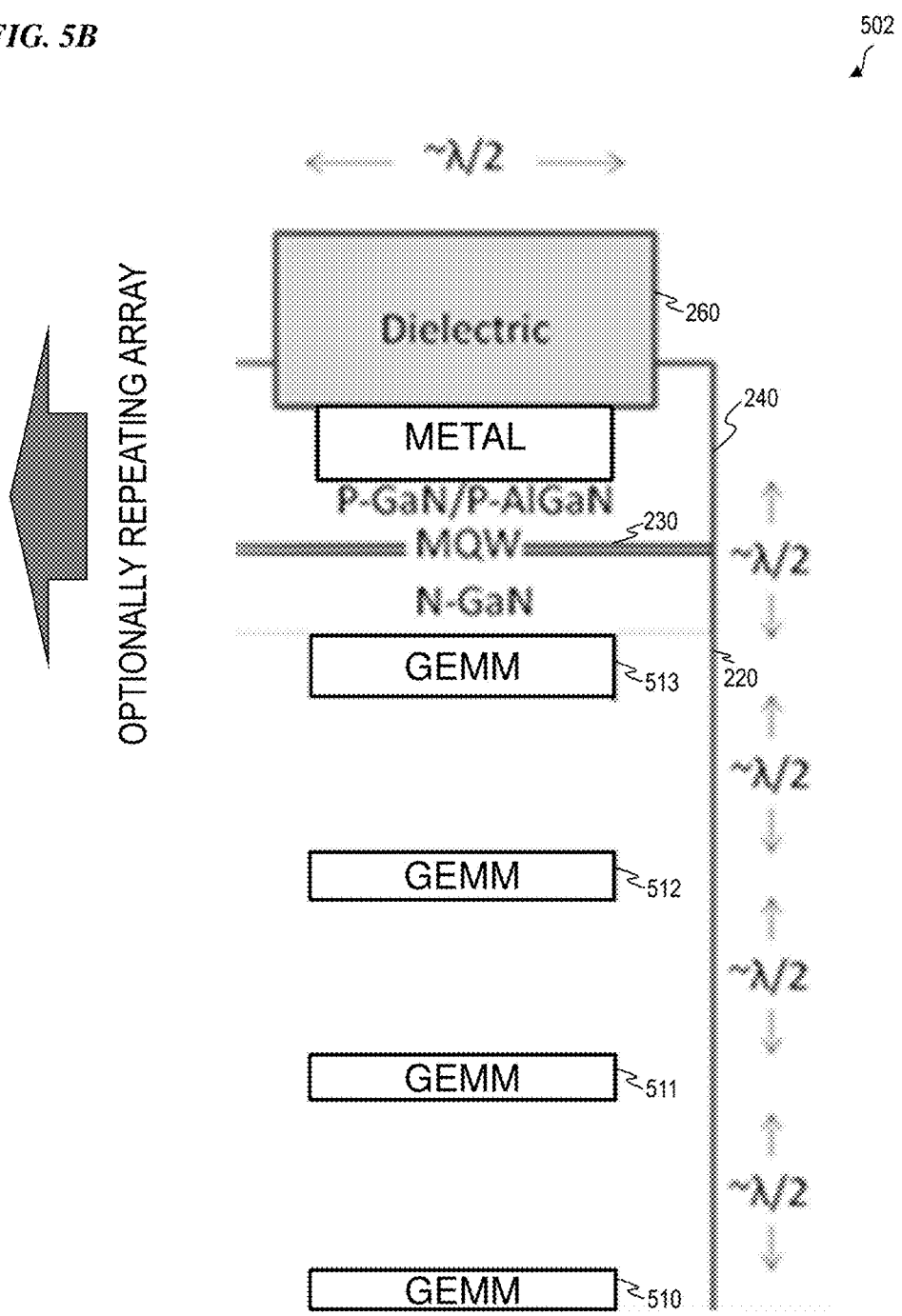
FIG. 5B is a schematic diagram of a GEMM-based, plasmonic, light-emitting structure 502, according to some embodiments of the present invention.

FIG. 5B is a schematic diagram of a GEMM-based, plasmonic, light-emitting structure 502, according to some embodiments of the present invention. In some embodiments, structure 502 is substantially similar to structure 501 except that metal layer 250 and at least a portion of dielectric layer 260 is embedded within layer 240.

FIG. 5C is a schematic diagram of a GEMM-based, plasmonic, light-emitting structure 503, according to some embodiments of the present invention. In some embodiments, structure 503 is substantially similar to structure 501 except that metal layer 250 is fully embedded within layer 240, dielectric layer 260 is directly on layer 240, and an additional fifth GEMM layer 514 is added (in some such embodiments, GEMM layer 514 has a thickness that is greater than the thickness of each of layers 510-513). In some embodiments, metal layer 250 and each of the GEMM layers 510-514 has a width that is less than or equal to approximately ½ the wavelength of the emitted light.

Figure 5D:
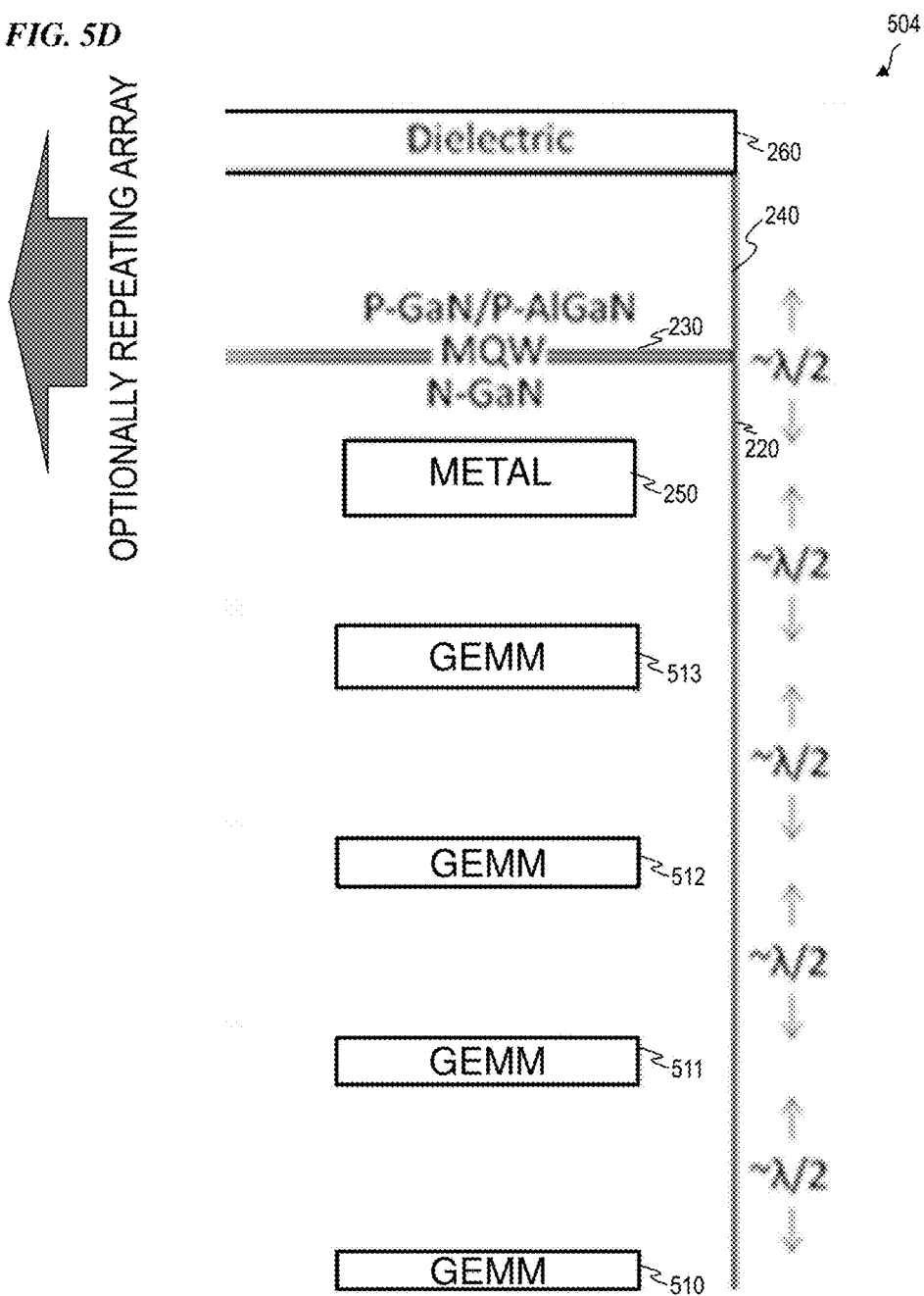
FIG. 5D is a schematic diagram of a light-emitting structure 504, according to some embodiments of the present invention.

FIG. 5D is a schematic diagram of a light-emitting structure 504, according to some embodiments of the present invention. In some embodiments, structure 504 is similar to structure 501 except that dielectric layer 260 is directly on layer 240 and metal layer 250 is located on the opposite side of active region 230 as dielectric layer 260.

Figure 6:
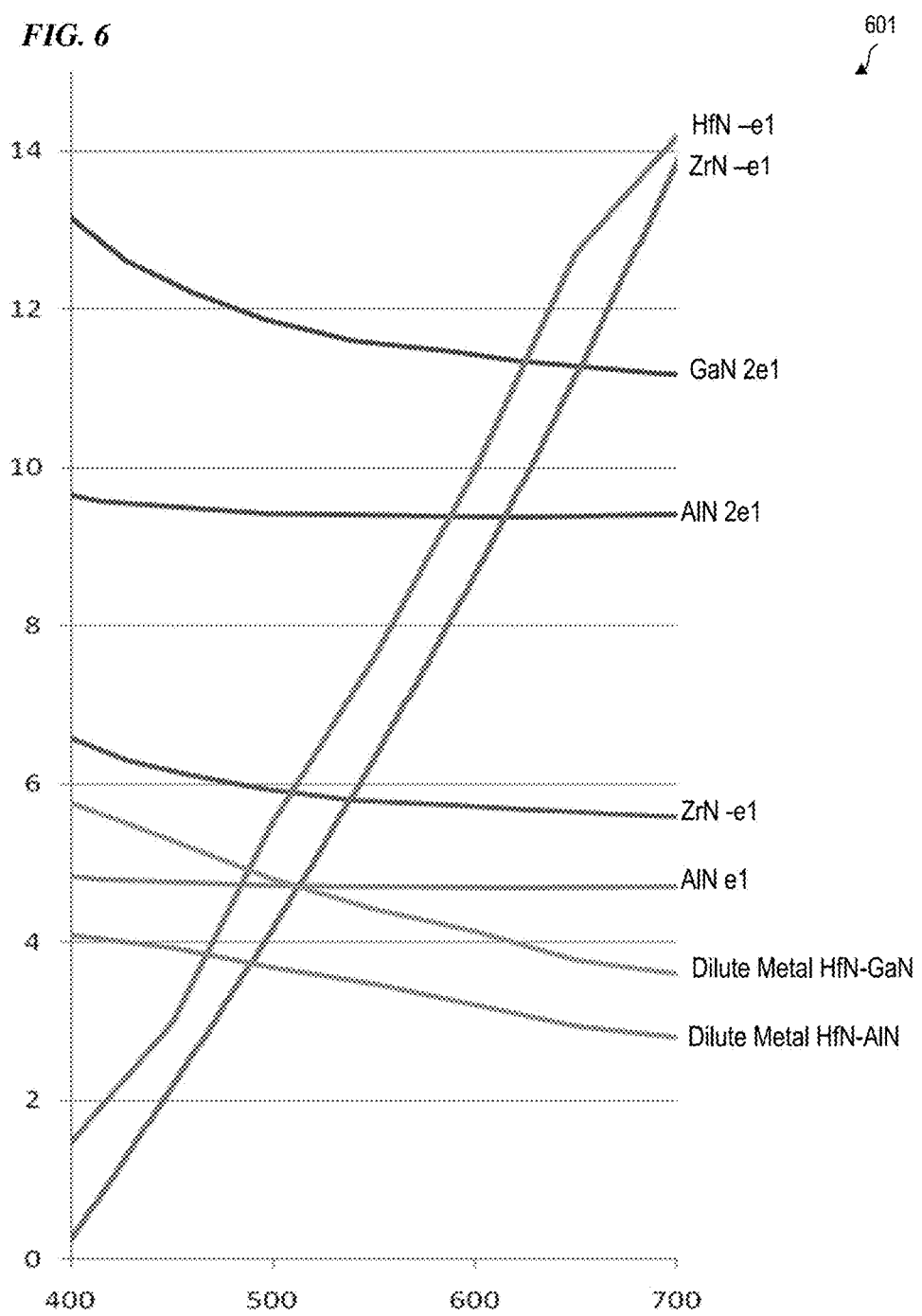
FIG. 6 is a graph 601 showing the optical properties for various GEMM materials as wavelength is changed within the visible spectrum, according to some embodiments of the present invention.

FIG. 6 is a graph 601 showing the optical properties for various GEMM materials as wavelength is changed within the visible spectrum, according to some embodiments of the present invention. For surface plasmons, e1D (e1 of the dielectric)+e1M (e1 of the metal)=0. For localized surface plasmons, 2e1D+e1M=0. In some embodiments, the plasmon-penetration depth of GaN—HfN is about 48 nm. In some embodiments, the plasmon-penetration depth of AlN—HfN is about 45 nm. In some embodiments, the present invention provides a device that includes a HfN/GaN "dilute metal" GEMM as a substrate (e.g., a first layer of 80-nm-thick GaN, followed by a first layer of 10-nm-thick HfN, followed by second layer of 80-nm-thick GaN, followed by second layer of 10-nm-thick HfN), AlN on the "dilute metal" substrate, an active region on the AlN, wherein the active region includes one or more quantum wells (QWs), and p-GaN on the active region.

FIG. 7 is a table 701 describing Metal-Organic Chemical Vapor Deposition (MOCVD) nucleation recipes for high-quality gallium polar or nitrogen polar growth of GaN or AlN upon ZrN or HfN, according to some embodiments of the present invention. In some embodiments, conditions A-Z are performed/achieved in alphabetical order. In some embodiments, conditions A-Z are achieved in any other suitable order. In some embodiments, any combination and/or sequence of conditions A-Z are achieved. In some embodiments, any combination and/or sequence of conditions A-Z are performed on at least one material selected from the group consisting of sapphire, silicon, GaN, AlN, MgO, SiC, TiN (titanium nitride), ZrN, HfN, W, or any other suitable template.

Figure 8:
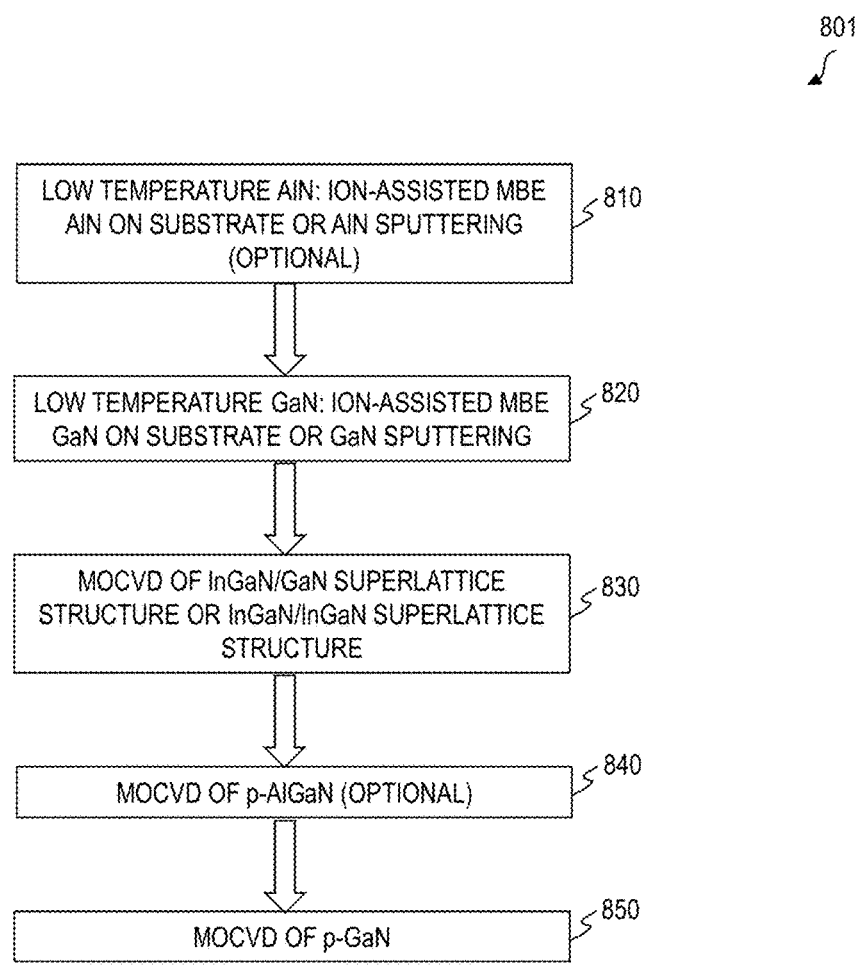
FIG. 8 is a flowchart showing a process 801 for producing an LED for large-sized wafers, according to some embodiments of the present invention.

FIG. 8 is a flowchart showing a process 801 for producing an LED for large-sized wafers, according to some embodiments of the present invention. In some embodiments, at block 810, low-temperature aluminum nitride (AlN) is formed by ion-assisted molecular-beam epitaxy (MBE) of AlN on a substrate or by AlN sputtering. In some embodiments, at block 820, low-temperature gallium nitride (GaN) is formed by ion-assisted MBE of GaN on a substrate or by GaN sputtering. In some embodiments, at block 830, MOCVD of InGaN/GaN superlattice structure or InGaN/InGaN superlattice structure is performed. In some embodiments, at block 840, MOCVD of p-AlGaN is performed (in some embodiments of process 801, block 840 is not performed). In some embodiments, at block 850, MOCVD of p-GaN is performed.

Figure 9A:
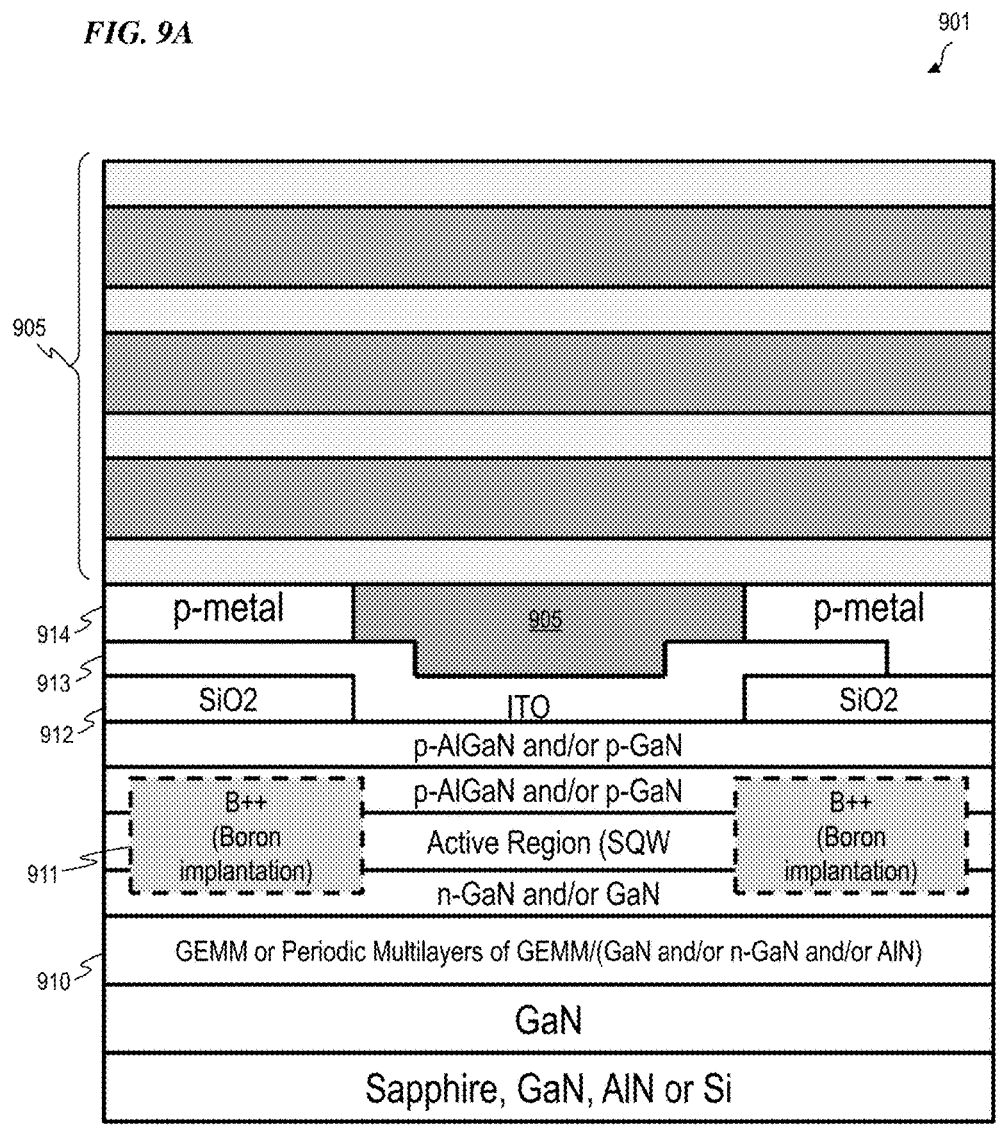
FIG. 9A is a schematic diagram of a light-emitting structure 901, according to some embodiments of the present invention.

FIG. 9A is a schematic diagram of a light-emitting structure 901, according to some embodiments of the present invention. In some embodiments, structure 901 is formed in a manner similar to methods described in the '624 patent, which is introduced above and incorporated herein by reference in its entirety, except that structure 901 further includes $SiO_2$ layers 912, ITO (indium tin oxide) layer 913, and boron-implantation layers 911 arranged as shown in FIG. 9A to optically and electrically confine structure 901. In some embodiments, ITO layer 913 is replaced with a thin metal or other transparent conductor. In some embodiments, structure 901 includes a distributed Bragg grating (DBG) 905, one or more layers of grown-epitaxial metal mirror (GEMM) 910, and p-type metal (p-metal) layers 914. In some embodiments, p-metal layers 914 include at least one selected from the group consisting of palladium, gold, silver, nickel, chrome, and aluminum.

Figure 9B:
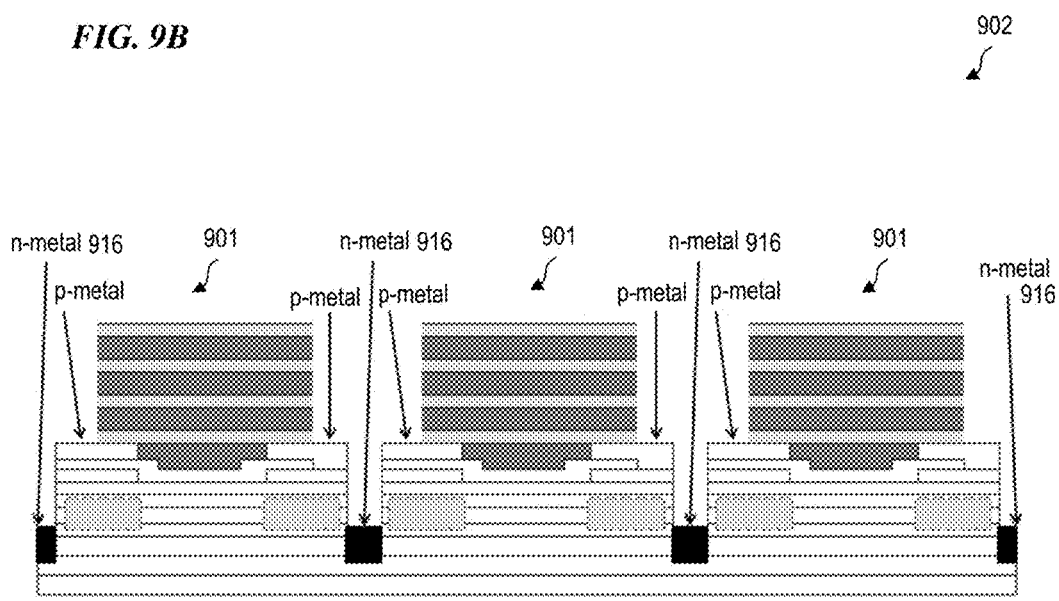
FIG. 9B is a schematic diagram of a light-emitting array structure 902, according to some embodiments of the present invention.

FIG. 9B is a schematic diagram of a light-emitting array structure 902, according to some embodiments of the present invention. In some embodiments, structure 902 is an array of structures 901 (either addressable or nonaddressable) where each respective structure 901 is separated from adjacent structures 901. In some embodiments, structure 902 includes n-type metal (n-metal) layers 916. In some embodiments, n-metal layers 916 include at least one selected from the group consisting of titanium, gold, silver, nickel, chrome, and aluminum. In some embodiments, structure 902 provides optical and electrical confinement while using GEMM materials and structures so as to create an array and/or to help better enable stimulated emission (or lower the lasing threshold).

In some embodiments, the present invention provides an apparatus that includes a hyper emission green light-emitting diode on a lattice-matched metal substrate, configured for advanced optical fiber networking.

In some embodiments, the present invention provides a light-emitting device that includes a first mirror having a first face and an opposite second face, wherein the first mirror includes a metal; and an epitaxial structure wherein the epitaxial structure is in contact with at least a portion of the first face of the first mirror, the epitaxial structure including an active region configured to emit light at a wavelength a, wherein the active region is positioned a first distance away from the first face of the first mirror such that there is plasmonic coupling between the active region and the first mirror.

In some embodiments, the present invention provides a light-emitting device that includes a first mirror having a first face and an opposite second face, wherein the first mirror includes a metal and is a grown-epitaxial metal mirror (GEMM); and an epitaxial structure wherein the epitaxial structure is in contact with at least a portion of the first face of the first mirror, the epitaxial structure including an active region configured to emit light at a wavelength λ, wherein the active region is positioned a first distance away from the first face of the first mirror such that there is plasmonic coupling between the active region and the first mirror.

In some embodiments of the device, the epitaxial structure further includes an n-type group III-nitride layer positioned between the first mirror and the active region; and a p-type group III-nitride structure covering at least a portion of a face of the active region that is opposite the first face of the first mirror. In some embodiments, the metal of the first mirror includes $Hf_xZr_{1-x}$, where x is between 0 and 1, inclusive. In some embodiments, the first distance is approximately one-fourth (¼) of the wavelength λ.

In some embodiments, the device further includes a second mirror in contact with the epitaxial structure, wherein the second mirror includes a metal. In some embodiments, the device further includes a second mirror in contact with the epitaxial structure, wherein the second mirror includes a metal, and wherein the second mirror is an optical disk antenna. In some embodiments, the device further includes a second mirror in contact with the epitaxial structure, wherein the second mirror includes a metal, and wherein the second mirror has a width of approximately one-half (½) of the wavelength $\lambda$. In some embodiments, the device further includes a second mirror in contact with the epitaxial structure, wherein the second mirror includes a metal; and a dielectric material. In some embodiments of the device, the epitaxial structure has a first index-of-refraction value, the device further including a second mirror in contact with the epitaxial structure, wherein the second mirror includes a metal; and a dielectric material, wherein the dielectric material has a second index-of-refraction value that is greater than the first index-of-refraction value of the epitaxial structure. In some embodiments, the epitaxial structure has a first index-of-refraction value, the device further including a second mirror in contact with the epitaxial structure, wherein the second mirror includes a metal; a dielectric material, wherein the dielectric material has a second index-of-refraction value that is greater than the first index-of-refraction value of the epitaxial structure; and wherein the second mirror and at least a portion of the dielectric material are embedded within the epitaxial structure. In some embodiments, the epitaxial structure has a first index-of-refraction value, the device further including a second mirror in contact with the epitaxial structure, wherein the second mirror includes a metal; a dielectric material, wherein the dielectric material has a second index-of-refraction value that is greater than the first index-of-refraction value of the epitaxial structure; wherein the second mirror is embedded within the epitaxial structure; and wherein the dielectric material covers at least a portion of a surface of the epitaxial structure.

In some embodiments, the device further includes a second mirror having a first face and an opposite second face, wherein the second mirror includes a metal and is a grown-epitaxial metal mirror (GEMM), wherein the epitaxial structure is in contact with and covering at least a portion of the first face of the second mirror, wherein the first mirror is partially transparent, and wherein a thickness of the second mirror is greater than a thickness of the first mirror. In some embodiments, the first mirror and the second mirror are vertically separated by a distance of approximately one-half (½) of the wavelength $\lambda$. In some embodiments, the device further includes a third mirror in contact with the epitaxial structure, wherein the third mirror includes a metal; and a dielectric material.

In some embodiments of the device, the first mirror is one of a plurality of GEMM layers in contact with the epitaxial structure including the first mirror, a second GEMM layer, and a third GEMM layer. In some embodiments, the first mirror is one of a plurality of GEMM layers in contact with the epitaxial structure including the first mirror, a second GEMM layer, and a third GEMM layer, wherein a width of the second GEMM layer is approximately one-half (½) of the wavelength $\lambda$. In some embodiments, the first mirror is one of a plurality of GEMM layers in contact with the epitaxial structure including the first mirror, a second GEMM layer, and a third GEMM layer, wherein the second GEMM layer and the third GEMM layer are vertically separated by a distance of approximately one-half (½) of the wavelength $\lambda$. In some embodiments, the first mirror is one of a plurality of GEMM layers in contact with the epitaxial structure including the first mirror, a second GEMM layer, and a third GEMM layer, wherein each one of the plurality of GEMM layers is partially transparent.

In some embodiments, the present invention provides a method of fabricating a light-emitting device, the method including epitaxially growing a first mirror having a first face and an opposite second face, wherein the first mirror includes a metal and is a grown-epitaxial metal mirror (GEMM); and epitaxially growing a light-emitting-device (LED) structure wherein the LED structure is in contact with at least a portion of the first face of the first mirror, the LED structure including an active region configured to emit light at a wavelength $\lambda$, wherein the active region is positioned a first distance away from the first face of the first mirror such that there is plasmonic coupling between the active region and the first mirror.

In some embodiments, the present invention provides a light-emitting device that includes a first mirror having a first face, wherein the first mirror includes a metal; and an epitaxial structure wherein the epitaxial structure is in contact with at least a first portion of the first face of the first mirror, the epitaxial structure including an active region having a first face and a second face and configured to emit light at a wavelength $\lambda$, wherein the first face of the active region is positioned a first distance away from the first face of the first mirror such that there is plasmonic coupling between the active region and the first mirror.

In some embodiments, the present invention provides a light-emitting device that includes a first mirror having a first face, wherein the first mirror includes a metal and is a grown-epitaxial metal mirror (GEMM); and an epitaxial structure, wherein the epitaxial structure is lattice matched with and in contact with at least a first portion of the first face of the first mirror, wherein the epitaxial structure includes an active region configured to emit light at a wavelength $\lambda$, wherein the active region is located a first non-zero distance away from the first face of the first mirror such that there is plasmonic coupling between the active region and the first mirror.

In some embodiments of the device, the epitaxial structure further includes an n-type group III-nitride layer positioned between the first mirror and the first face of the active region; and a p-type group III-nitride structure in contact with at least a portion of the second face of the active region that is opposite the first face of the active region. In some embodiments, the metal of the first mirror includes $Hf_xZr_{1-x}$, where x is between 0 and 1, inclusive. In some embodiments, the epitaxial structure is lattice matched with the first portion of the first face of the first mirror. In some embodiments, the first distance is approximately one-fourth (¼) of the wavelength $\lambda$.

In some embodiments, the device further includes a second mirror in contact with the epitaxial structure, wherein the second mirror includes a metal, and wherein the second mirror is facing the second face of the active region. In some embodiments, the device further includes a second mirror in contact with the epitaxial structure, wherein the second mirror includes a multilayer dielectric, and wherein the second mirror is facing the second face of the active region. In some embodiments, the device further includes a second mirror in contact with the epitaxial structure, wherein the second mirror includes a metal, wherein the second mirror is facing the second face of the active region, and wherein the second mirror includes an optical disk antenna. In some embodiments, the device further includes a second mirror having a first face in contact with the epitaxial structure, wherein the second mirror includes a metal, wherein the second mirror is facing the second face of the active region, and wherein the first face of second mirror has a width of approximately one-half (½) of the wavelength λ. In some embodiments, the device further includes a second mirror, wherein the second mirror has a first face that is in contact with the epitaxial structure and facing the second face of the active region, wherein the second mirror has a second face, wherein the second mirror includes a metal; and a dielectric material in contact with the second face of the second mirror.

In some embodiments of the device, the epitaxial structure has a first index-of-refraction value, and the device further including a second mirror having a first face in contact with the epitaxial structure and having a second face, wherein the second mirror includes a metal; and a dielectric material in contact with the second face of the second mirror, wherein the dielectric material has a second index-of-refraction value that is greater than the first index-of-refraction value of the epitaxial structure. In some embodiments, the epitaxial structure has a first index-of-refraction value, and the device further includes a second mirror having a first face in contact with the epitaxial structure and having a second face, wherein the second mirror includes a metal; and a dielectric material in contact with the second face of the second mirror, wherein the dielectric material has a second index-of-refraction value that is greater than the first index-of-refraction value of the epitaxial structure; and wherein the second mirror and at least a portion of the dielectric material are embedded within the epitaxial structure. In some embodiments, the epitaxial structure has a first index-of-refraction value, and the device further includes a second mirror, wherein the second mirror is embedded within the epitaxial structure, wherein the second mirror includes a metal; and a dielectric material, wherein the dielectric material has a second index-of-refraction value that is greater than the first index-of-refraction value of the epitaxial structure, and wherein the dielectric material covers at least a portion of a surface of the epitaxial structure.

In some embodiments, the device further includes a second mirror having a first face, wherein the second mirror includes a metal and is a grown-epitaxial metal mirror (GEMM), wherein the epitaxial structure is in contact with and covering at least a portion of the first face of the second mirror, wherein the first mirror is partially transparent, and wherein a thickness of the second mirror is greater than a thickness of the first mirror. In some embodiments, the first mirror and the second mirror are vertically separated by a distance of approximately one-half (½) of the wavelength λ. In some embodiments, the device further includes a third mirror in contact with the epitaxial structure, wherein the third mirror includes a metal; and a dielectric material.

In some embodiments of the device, the first mirror is one of a plurality of GEMM layers in contact with the epitaxial structure including the first mirror, a second GEMM layer, and a third GEMM layer. In some embodiments, the first mirror is one of a plurality of GEMM layers in contact with the epitaxial structure including the first mirror, a second GEMM layer, and a third GEMM layer, wherein a width of the second GEMM layer is approximately one-half (½) of the wavelength λ. In some embodiments, the first mirror is one of a plurality of GEMM layers in contact with the epitaxial structure including the first mirror, a second GEMM layer, and a third GEMM layer, wherein the second GEMM layer and the third GEMM layer are vertically separated by a distance of approximately one-half (½) of the wavelength λ. In some embodiments, the first mirror is one of a plurality of GEMM layers in contact with the epitaxial structure including the first mirror, a second GEMM layer, and a third GEMM layer, wherein each one of the plurality of GEMM layers is partially transparent.

In some embodiments, the present invention provides a method of fabricating a light-emitting device, the method including forming a first mirror having a first face, wherein the first mirror includes a metal; and epitaxially growing an epitaxial structure, wherein the epitaxial structure is lattice matched with and in contact with at least a first portion of the first face of the first mirror, wherein the epitaxial structure includes an active region configured to emit light at a wavelength λ, wherein the active region is located a first non-zero distance away from the first face of the first mirror such that there is plasmonic coupling between the active region and the first mirror.

In some embodiments, the present invention provides a method of fabricating a light-emitting device, the method including epitaxially growing a first mirror having a first face, wherein the first mirror includes a metal and is a grown-epitaxial metal mirror (GEMM); and epitaxially growing an epitaxial structure, wherein the epitaxial structure is lattice matched with and in contact with at least a first portion of the first face of the first mirror, wherein the epitaxial structure includes an active region configured to emit light at a wavelength λ, wherein the active region is located a first non-zero distance away from the first face of the first mirror such that there is plasmonic coupling between the active region and the first mirror.

In some embodiments of the method, the epitaxially growing of the epitaxial structure includes forming an n-type group III-nitride layer between the first mirror and the first face of the active region; and forming a p-type group III-nitride structure in contact with at least a portion of the second face of the active region that is opposite the first face of the active region. In some embodiments, the metal of the first mirror includes $Hf_xZr_{1-x}$, where x is between 0 and 1, inclusive. In some embodiments, the epitaxial structure is lattice matched with the first portion of the first face of the first mirror. In some embodiments, the first distance is approximately one-fourth (¼) of the wavelength λ.

In some embodiments, the method further includes forming a second mirror in contact with the epitaxial structure, wherein the second mirror includes a metal, and wherein the second mirror is facing the second face of the active region. In some embodiments, the method further includes forming a second mirror in contact with the epitaxial structure, wherein the second mirror includes a multilayer dielectric, and wherein the second mirror is facing the second face of the active region. In some embodiments, the method further includes forming a second mirror in contact with the epitaxial structure, wherein the second mirror includes a metal, wherein the second mirror is facing the second face of the active region, and wherein the second mirror includes an optical disk antenna. In some embodiments, the method further includes forming a second mirror having a first face in contact with the epitaxial structure, wherein the second mirror includes a metal, wherein the second mirror is facing the second face of the active region, and wherein the first face of second mirror has a width of approximately one-half (½) of the wavelength λ. In some embodiments, the method further includes forming a second mirror, wherein the second mirror has a first face that is in contact with the epitaxial structure and facing the second face of the active region, wherein the second mirror has a second face, wherein the second mirror includes a metal; and forming a dielectric material in contact with the second face of the second mirror.

In some embodiments of the method, the epitaxial structure has a first index-of-refraction value, and the method further includes forming a second mirror having a first face in contact with the epitaxial structure and having a second face, wherein the second mirror includes a metal; and forming a dielectric material in contact with the second face of the second mirror, wherein the dielectric material has a second index-of-refraction value that is greater than the first index-of-refraction value of the epitaxial structure. In some embodiments, the epitaxial structure has a first index-of-refraction value, and the method further includes forming a second mirror having a first face in contact with the epitaxial structure and having a second face, wherein the second mirror includes a metal, wherein the forming of the second mirror includes embedding the second mirror within the epitaxial structure; and forming a dielectric material in contact with the second face of the second mirror, wherein the dielectric material has a second index-of-refraction value that is greater than the first index-of-refraction value of the epitaxial structure, and wherein the forming of the dielectric material includes embedding at least a portion of the dielectric material within the epitaxial structure. In some embodiments, the epitaxial structure has a first index-of-refraction value, and the method further includes forming a second mirror, wherein the forming of the second mirror includes embedding the second mirror within the epitaxial structure, wherein the second mirror includes a metal; and forming a dielectric material, wherein the dielectric material has a second index-of-refraction value that is greater than the first index-of-refraction value of the epitaxial structure, and wherein the dielectric material covers at least a portion of a surface of the epitaxial structure.

In some embodiments, the method further includes forming a second mirror having a first face, wherein the second mirror includes a metal and is a grown-epitaxial metal mirror (GEMM), wherein the epitaxial structure is in contact with and covering at least a portion of the first face of the second mirror, wherein the first mirror is partially transparent, and wherein a thickness of the second mirror is greater than a thickness of the first mirror. In some embodiments, the first mirror and the second mirror are vertically separated by a distance of approximately one-half (½) of the wavelength $\lambda$. In some embodiments, the method further includes forming a third mirror in contact with the epitaxial structure, wherein the third mirror includes a metal; and forming a dielectric material in contact with the second face of the second mirror.

In some embodiments of the method, the epitaxially growing of the first mirror includes epitaxially growing a plurality of GEMM layers in contact with the epitaxial structure including the first mirror, a second GEMM layer, and a third GEMM layer. In some embodiments, the epitaxially growing of the first mirror includes epitaxially growing a plurality of GEMM layers in contact with the epitaxial structure including the first mirror, a second GEMM layer, and a third GEMM layer, wherein a width of the second GEMM layer is approximately one-half (½) of the wavelength $\lambda$. In some embodiments, the epitaxially growing of the first mirror includes epitaxially growing a plurality of GEMM layers in contact with the epitaxial structure including the first mirror, a second GEMM layer, and a third GEMM layer, wherein the second GEMM layer and the third GEMM layer are vertically separated by a distance of approximately one-half (½) of the wavelength $\lambda$. In some embodiments, the epitaxially growing of the first mirror includes epitaxially growing a plurality of GEMM layers in contact with the epitaxial structure including the first mirror, a second GEMM layer, and a third GEMM layer, wherein each one of the plurality of GEMM layers is partially transparent.

In some embodiments, the present invention provides an apparatus that includes means for epitaxially growing a grown-epitaxial metal mirror (GEMM) (e.g., the GEMM shown in FIGS. 2A-2C, 3A-3D, 4A-4D, and 5A-5D); and means for epitaxially growing an epitaxial structure (e.g., the epitaxial structure shown in FIGS. 2A-5D), wherein the epitaxial structure is in contact with at least a first portion of the GEMM, and wherein the epitaxial structure and the GEMM are grown such that there is plasmonic coupling between the epitaxial structure and the GEMM.

In some embodiments, the present invention provides an apparatus that includes means for forming a first mirror; and means for epitaxially growing an epitaxial structure, wherein the epitaxial structure is in contact with at least a first portion of the first mirror, and wherein the epitaxial structure and the first mirror are grown such that there is plasmonic coupling between the epitaxial structure and the first mirror.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment). Further, some embodiments include fewer than all the components described as part of any one of the embodiments described herein. Still further, it is specifically contemplated that the present invention includes embodiments having combinations and subcombinations of the various embodiments described herein and the various embodiments described by the related applications and publications incorporated by reference in the "CROSS-REFERENCE TO RELATED APPLICATIONS" section of the present description.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A light-emitting device comprising:
a first mirror having a first face, wherein the first mirror includes a metal and is a grown-epitaxial metal mirror (GEMM);
an epitaxial structure, wherein the epitaxial structure is lattice matched with and in contact with at least a first portion of the first face of the first mirror, wherein the epitaxial structure includes an active region configured to emit light at a wavelength $\lambda$, wherein the active region is located a first non-zero distance away from the first face of the first mirror such that there is plasmonic coupling between the active region and the first mirror, wherein the epitaxial structure has a first index-of-refraction value;

a second mirror having a first face in contact with the epitaxial structure and having a second face, wherein the second mirror includes a metal; and a dielectric material in contact with the second face of the second mirror, wherein the dielectric material has a second index-of-refraction value that is greater than the first index-of-refraction value of the epitaxial structure.

2. The light-emitting device of claim 1, wherein the active region has a first face, and a second face opposite the first face of the active region, and wherein the epitaxial structure further includes:

an n-type group III-nitride layer positioned between the first mirror and the first face of the active region; and a p-type group III-nitride structure in contact with at least a portion of the second face of the active region.

3. The light-emitting device of claim 1, wherein the metal of the first mirror includes $Hf_xZr_{1-x}$, where x is between 0 and 1, inclusive.

4. The light-emitting device of claim 1, wherein the first distance is approximately one-fourth (¼) of the wavelength $\lambda$.

5. The light-emitting device of claim 1, further comprising:

a third mirror in contact with the epitaxial structure, wherein the third mirror includes a metal and is a grown-epitaxial metal mirror (GEMM).

6. The light-emitting device of claim 1, further comprising:

a third mirror in contact with the epitaxial structure, wherein the third mirror includes a metal and is a grown-epitaxial metal mirror (GEMM), and wherein the first mirror and the third mirror are vertically separated by a distance of approximately one-half (½) of the wavelength $\lambda$.

7. The light-emitting device of claim 1, further comprising:

a third mirror in contact with the epitaxial structure, wherein the third mirror includes a metal and is a grown-epitaxial metal mirror (GEMM), wherein the first mirror is partially transparent, and wherein a thickness of the third mirror is greater than a thickness of the first mirror.

8. The light-emitting device of claim 1, wherein the second mirror and at least a portion of the dielectric material are embedded within the epitaxial structure.

9. The light-emitting device of claim 1, wherein the first mirror is one of a plurality of GEMM layers in contact with the epitaxial structure including the first mirror, a second GEMM layer, and a third GEMM layer, wherein each one of the plurality of GEMM layers is partially transparent.

10. A light-emitting device comprising:

a first mirror having a first face, wherein the first mirror includes a metal and is a grown-epitaxial metal mirror (GEMM);

an epitaxial structure, wherein the epitaxial structure is lattice matched with and in contact with at least a first portion of the first face of the first mirror, wherein the epitaxial structure includes an active region configured to emit light at a wavelength $\lambda$, wherein the active region is located a first non-zero distance away from the first face of the first mirror such that there is plasmonic coupling between the active region and the first mirror, wherein the epitaxial structure has a first index-of-refraction value;

a second mirror, wherein the second mirror is embedded within the epitaxial structure, wherein the second mirror includes a metal; and a dielectric material, wherein the dielectric material has a second index-of-refraction value that is greater than the first index-of-refraction value of the epitaxial structure, and wherein the dielectric material covers at least a portion of a surface of the epitaxial structure.

11. The light-emitting device of claim 1, wherein the first mirror is one of a plurality of GEMM layers in contact with the epitaxial structure including the first mirror, a second GEMM layer, and a third GEMM layer.

12. The light-emitting device of claim 1, wherein the first mirror is one of a plurality of GEMM layers in contact with the epitaxial structure including the first mirror, a second GEMM layer, and a third GEMM layer, wherein a width of the second GEMM layer is approximately one-half (½) of the wavelength $\lambda$.

13. The light-emitting device of claim 1, wherein the first mirror is one of a plurality of GEMM layers in contact with the epitaxial structure including the first mirror, a second GEMM layer, and a third GEMM layer, wherein the second GEMM layer and the third GEMM layer are vertically separated by a distance of approximately one-half (½) of the wavelength $\lambda$.

14. The light-emitting device of claim 10, wherein the metal of the first mirror includes $Hf_xZr_{1-x}$, where x is between 0 and 1, inclusive.

15. The light-emitting device of claim 10, wherein the first distance is approximately one-fourth (¼) of the wavelength $\lambda$.

16. A light-emitting device comprising:

a first mirror having a first face, wherein the first mirror includes a metal and is a grown-epitaxial metal mirror (GEMM);

a second mirror, wherein the second mirror has a first width;

an epitaxial structure, wherein the epitaxial structure is in contact with at least a first portion of the first face of the first mirror, wherein the epitaxial structure includes an active region configured to emit light at a wavelength $\lambda$, wherein the light emitted by the active region is laterally confined to a second width that is smaller than the first width of the second mirror, wherein the epitaxial structure has a first index-of-refraction value, wherein the second mirror has a first face and a second face, wherein the first face of the second mirror is in contact with the epitaxial structure, wherein the second mirror includes a metal; and a dielectric material in contact with the second face of the second mirror, wherein the dielectric material has a second index-of-refraction value that is greater than the first index-of-refraction value of the epitaxial structure.

17. The light-emitting device of claim 16, further comprising:

a third mirror in contact with the epitaxial structure, wherein the third mirror includes a metal and is a grown-epitaxial metal mirror (GEMM), and wherein the first mirror and the third mirror are vertically separated by a distance of approximately one-half (½) of the wavelength $\lambda$.

18. The light-emitting device of claim 16, wherein the metal of the first mirror includes $Hf_xZr_{1-x}$, where x is between 0 and 1, inclusive.

19. The light-emitting device of claim 16, wherein the active region has a first face, and a second face opposite the first face of the active region, and wherein the epitaxial structure further includes:
- an n-type group III-nitride layer positioned between the first mirror and the first face of the active region; and
- a p-type group III-nitride structure in contact with at least a portion of the second face of the active region.

20. The light-emitting device of claim 16, wherein the second mirror and at least a portion of the dielectric material are embedded within the epitaxial structure.

* * * * *